United States Patent
Maillot et al.

(10) Patent No.: US 11,157,057 B1
(45) Date of Patent: Oct. 26, 2021

(54) SYSTEMS AND METHODS FOR ELECTRIC SYSTEMS MONITORING AND/OR FAILURE DETECTION

(71) Applicant: OVH, Roubaix (FR)

(72) Inventors: Patrick-Gilles Maillot, Marsanne (FR); Michel Bieske, Wasquehal (FR); Bastien Cecchinato, Villeurbanne (FR); Christophe Maurice Thibaut, Houplin Ancoisne (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 17/308,820

(22) Filed: May 5, 2021

(30) Foreign Application Priority Data

May 28, 2020 (EP) .................................. 20315274
May 28, 2020 (EP) .................................. 20315275

(51) Int. Cl.
*G06F 1/30* (2006.01)
*G06F 1/3206* (2019.01)
(Continued)

(52) U.S. Cl.
CPC ................ *G06F 1/30* (2013.01); *G06F 1/189* (2013.01); *G06F 1/28* (2013.01); *G06F 1/3206* (2013.01)

(58) Field of Classification Search
CPC ... G06F 1/30; G06F 1/189; G06F 1/28; G06F 1/3206
See application file for complete search history.

(56) References Cited

U.S. PATENT DOCUMENTS

| 4,041,381 A | 8/1977 | Hwa |
| 5,319,571 A | 6/1994 | Langer et al. |

(Continued)

FOREIGN PATENT DOCUMENTS

| CN | 1725707 A | 1/2006 |
| CN | 1917433 A | 2/2007 |

(Continued)

OTHER PUBLICATIONS

Galli et al., "For the Grid and Through the Grid: The Role of Power Line Communications in the Smart Grid", The Proceedings of the IEEE, 2011, pp. 1-26.

(Continued)

*Primary Examiner* — Aurel Prifti
(74) *Attorney, Agent, or Firm* — BCF LLP

(57) ABSTRACT

A system for electric system failure detection and localisation in a datacenter comprises a plurality of power distribution units (PDUs), each of the plurality of PDUs comprising a plurality of electric power outlets and is configured to sense one or more power parameters relating to each of its electric power outlets, generate electric system operating data, and, upon receipt of a request, transmit of the electric system operating data to a networking device. A plurality of communicating circuit-breakers, connected to the plurality of PDUs, emits status signals. The networking device, communicably connected to the plurality of PDUs via a first datalink and to the plurality of communicating circuit-breakers via a second datalink, is configured to detect and locate an electric system failure based on the electric system operating data and the status signals. A method for electric system failure detection and localisation in a datacenter is also provided.

15 Claims, 12 Drawing Sheets

(51) Int. Cl.
*G06F 1/28* (2006.01)
*G06F 1/18* (2006.01)

(56) References Cited

U.S. PATENT DOCUMENTS

| | | | |
|---|---|---|---|
| 6,400,802 B1 | 6/2002 | Legare | |
| 6,417,672 B1 | 7/2002 | Chong | |
| 6,574,576 B2 | 6/2003 | Chen et al. | |
| 6,690,177 B2 | 2/2004 | Dalebroux | |
| 6,917,888 B2 | 7/2005 | Logvinov et al. | |
| 7,030,734 B2 | 4/2006 | Butler et al. | |
| 7,030,771 B2* | 4/2006 | Kinnard | G06F 1/263 340/653 |
| 7,031,859 B2 | 4/2006 | Piesinger | |
| 7,034,663 B2 | 4/2006 | Mansfield et al. | |
| 7,203,849 B2 | 4/2007 | Dove | |
| 7,254,511 B2 | 8/2007 | Niedzwiecki et al. | |
| 7,269,753 B2 | 9/2007 | Farkas et al. | |
| 7,308,591 B2 | 12/2007 | Dubinsky | |
| 7,532,011 B2 | 5/2009 | Shi | |
| 7,646,225 B2 | 1/2010 | Song et al. | |
| 7,701,325 B2 | 4/2010 | White | |
| 7,870,374 B2 | 1/2011 | Cagno et al. | |
| 7,877,622 B2* | 1/2011 | Gruendler | G06F 11/2015 713/340 |
| 8,010,336 B2 | 8/2011 | Chaiquin | |
| 8,077,049 B2 | 12/2011 | Yaney et al. | |
| 8,165,723 B2 | 4/2012 | Nasle | |
| 8,188,855 B2 | 5/2012 | Sharma | |
| 8,239,073 B2 | 8/2012 | Fausak et al. | |
| 8,305,737 B2 | 11/2012 | Ewing et al. | |
| 8,359,177 B2 | 1/2013 | Lelong et al. | |
| 8,494,661 B2* | 7/2013 | Ewing | G05B 15/02 700/22 |
| 8,494,686 B2 | 7/2013 | Masters et al. | |
| 8,497,779 B1* | 7/2013 | Waide | G06F 1/263 340/636.1 |
| 8,564,920 B1* | 10/2013 | Smith | H02H 3/006 361/93.1 |
| 8,635,484 B2* | 1/2014 | Turicchi, Jr. | G06Q 10/06 713/340 |
| 8,639,459 B1* | 1/2014 | Morales | G06F 1/28 702/62 |
| 8,726,045 B2 | 5/2014 | Goodrum et al. | |
| 8,729,905 B2 | 5/2014 | McCormack et al. | |
| 8,732,508 B2 | 5/2014 | Cochran et al. | |
| 8,914,250 B2 | 12/2014 | Dzung et al. | |
| 9,122,466 B1* | 9/2015 | Kellett | H02J 9/00 |
| 9,143,197 B2 | 9/2015 | Vijayasankar et al. | |
| 9,182,795 B1* | 11/2015 | Hill | G06F 1/189 |
| 9,210,257 B2 | 12/2015 | Hall et al. | |
| 9,213,380 B2 | 12/2015 | Bandholz et al. | |
| 9,608,440 B2 | 3/2017 | Familiant et al. | |
| 9,835,662 B2 | 12/2017 | Driscoll et al. | |
| 9,841,449 B2 | 12/2017 | Mikulka et al. | |
| 9,871,406 B1* | 1/2018 | Churnock | H02J 3/0073 |
| 9,965,013 B1* | 5/2018 | McGee | G06F 1/30 |
| 10,459,016 B2 | 10/2019 | Driscoll et al. | |
| 10,571,493 B2 | 2/2020 | Sonderegger | |
| 10,831,251 B1* | 11/2020 | Ross | G06F 1/26 |
| 2003/0084112 A1 | 5/2003 | Curray et al. | |
| 2006/0085346 A1 | 4/2006 | Riley | |
| 2007/0002506 A1* | 1/2007 | Papallo | H02H 7/30 361/38 |
| 2007/0054622 A1 | 3/2007 | Berkman | |
| 2007/0135086 A1 | 6/2007 | Stanford | |
| 2007/0162620 A1 | 7/2007 | Terry et al. | |
| 2007/0189302 A1 | 8/2007 | Lee et al. | |
| 2007/0191992 A1 | 8/2007 | Taliaferro | |
| 2008/0221737 A1* | 9/2008 | Josephson | G01D 4/02 700/276 |
| 2008/0303353 A1* | 12/2008 | Yu | H02J 13/00007 307/131 |
| 2009/0089594 A1 | 4/2009 | Cagno et al. | |
| 2009/0189774 A1* | 7/2009 | Brundridge | H02J 13/00001 340/654 |
| 2009/0207753 A1 | 8/2009 | Bieganski | |
| 2009/0210178 A1 | 8/2009 | Bieganski | |
| 2009/0217073 A1* | 8/2009 | Brech | G06F 11/30 713/340 |
| 2009/0282274 A1* | 11/2009 | Langgood | G06F 1/3203 713/320 |
| 2009/0287943 A1* | 11/2009 | Brey | H02J 13/00007 713/300 |
| 2009/0287949 A1 | 11/2009 | Bradicich et al. | |
| 2010/0204850 A1* | 8/2010 | Henderieckx | H04B 3/542 700/297 |
| 2011/0047188 A1* | 2/2011 | Martins | H04L 12/10 707/803 |
| 2011/0116387 A1 | 5/2011 | Beeco et al. | |
| 2011/0167282 A1* | 7/2011 | Brown | G01R 22/063 713/310 |
| 2011/0218689 A1* | 9/2011 | Chan | G06F 1/28 700/295 |
| 2011/0320827 A1* | 12/2011 | Siegman | H02J 13/0005 713/300 |
| 2012/0117392 A1* | 5/2012 | Turicchi, Jr. | G06Q 50/06 713/300 |
| 2012/0189042 A1* | 7/2012 | Varadarajan | H04B 3/542 375/222 |
| 2012/0223840 A1* | 9/2012 | Guymon | H04B 3/54 340/870.02 |
| 2012/0239958 A1* | 9/2012 | Archibald | G06F 11/2015 713/340 |
| 2012/0330472 A1 | 12/2012 | Boot | |
| 2013/0002409 A1* | 1/2013 | Molina | H04B 3/542 340/12.32 |
| 2013/0020868 A1* | 1/2013 | Wu | H02J 13/00004 307/18 |
| 2013/0073882 A1* | 3/2013 | Inbaraj | G06F 1/3206 713/320 |
| 2013/0123998 A1* | 5/2013 | King | G06F 1/30 700/292 |
| 2013/0241284 A1* | 9/2013 | Santini | H02J 13/00002 307/31 |
| 2013/0253861 A1* | 9/2013 | Nicholson | H05K 7/1498 702/62 |
| 2014/0115353 A1* | 4/2014 | Hutten | G06F 1/266 713/310 |
| 2014/0143578 A1* | 5/2014 | Cenizal | H04B 3/54 713/340 |
| 2014/0164812 A1* | 6/2014 | Alshinnawi | G06F 1/188 713/330 |
| 2014/0164814 A1* | 6/2014 | Henise, IV | G06F 1/28 713/340 |
| 2014/0177736 A1* | 6/2014 | Alshinnawi | H02J 13/00017 375/257 |
| 2014/0181564 A1* | 6/2014 | Alshinnawi | G06F 1/189 713/340 |
| 2014/0355610 A1* | 12/2014 | Ge | H04L 45/74 370/392 |
| 2015/0074431 A1* | 3/2015 | Nguyen | H02J 3/0073 713/300 |
| 2015/0177814 A1* | 6/2015 | Bailey | G06F 1/28 713/320 |
| 2016/0195911 A1* | 7/2016 | Chapel | H02J 1/14 713/340 |
| 2016/0337512 A1 | 11/2016 | Kalavai | |
| 2016/0378631 A1* | 12/2016 | Calio | G06F 11/3065 713/340 |
| 2017/0149243 A1* | 5/2017 | Dozier | H02J 3/18 |
| 2017/0327242 A1* | 11/2017 | Lopez | H02M 1/44 |
| 2018/0052431 A1* | 2/2018 | Shaikh | G05B 13/048 |
| 2018/0074561 A1* | 3/2018 | Wang | G06F 1/30 |
| 2018/0131163 A1* | 5/2018 | Jen | H02J 13/0006 |
| 2018/0337554 A1* | 11/2018 | Thomas | H02J 9/062 |
| 2019/0123580 A1 | 4/2019 | Bindea et al. | |
| 2019/0243977 A1* | 8/2019 | Pfleger de Aguiar | G05B 19/05 |
| 2019/0377394 A1* | 12/2019 | Klaba | H02J 9/06 |
| 2020/0021106 A1* | 1/2020 | Thibaut | H02J 3/02 |

(56) References Cited

U.S. PATENT DOCUMENTS

| | | | |
|---|---|---|---|
| 2020/0042068 A1* | 2/2020 | Rong | G06F 1/3209 |
| 2020/0142465 A1* | 5/2020 | Jenne | G06F 1/3287 |
| 2020/0293101 A1* | 9/2020 | Krueger | G06F 1/30 |
| 2020/0295591 A1* | 9/2020 | Mohan | H02J 3/007 |
| 2021/0013735 A1* | 1/2021 | Pachoud | H02J 9/068 |

FOREIGN PATENT DOCUMENTS

| | | | |
|---|---|---|---|
| CN | 101983494 B | 8/2014 | |
| CN | 110601723 A | 12/2019 | |
| DE | 10112844 A1 | 9/2002 | |
| EP | 0724799 A1 | 8/1996 | |
| EP | 2158726 A2 | 3/2010 | |
| EP | 2260611 B1 | 8/2014 | |
| EP | 2863723 A2 | 4/2015 | |
| EP | 2572165 B1 | 11/2017 | |
| EP | 3272071 A1 | 1/2018 | |
| EP | 3065250 B1 | 11/2018 | |
| EP | 3595120 A1 | 1/2020 | |
| FR | 3033969 B1 | 3/2017 | |
| KR | 200435020 Y1 | 1/2007 | |
| KR | 100849920 B1 | 8/2008 | |
| WO | WO9501030 A1 | 1/1995 | |
| WO | 03073177 A1 | 9/2003 | |
| WO | 2006037605 A1 | 4/2006 | |
| WO | 2008157668 A3 | 1/2009 | |
| WO | 2009105169 A2 | 8/2009 | |
| WO | 2009123586 A1 | 10/2009 | |
| WO | 2010/151835 A2 | 12/2010 | |
| WO | 2013111760 A1 | 8/2013 | |
| WO | 2016151217 A1 | 9/2016 | |
| WO | 2017158608 A1 | 9/2017 | |
| WO | WO-2019172519 A1 * | 9/2019 | G06Q 50/30 |

OTHER PUBLICATIONS

Peng et al., "AMI Based Sensing Architecture for Smart Grid in IPV6 Networks", International Journal on Smart Sensing and Intelligent Systems 9.4: 2111(20). Exeley Inc. (Dec. 2016), pp. 1-8.

Luka et al., "Power Line Communications: A Platform for Sustainable Development", Research Gate, 3rd International Conference of African Development Issues, 2016, pp. 46-51.

Zhang et al., "Hybrid Communication Architectures for Distributed Smart Grid Applications", Energies, MDPI, 2018, vol. 11, pp. 1-16.

Rinaldi et al., "Performance analysis of power line communication in industrial power distribution network", Computer Standards & Interfaces, 2015, vol. 42, pp. 9-16.

Mlynek et al., "Simulation of Achievable Data Rates of Broadband Power Line Communication for Smart Metering", Applied Sciences, MDPI, 2019, vol. 9, pp. 1-22.

European Search Report with regard to the Patent Application No. 20315274.9 completed Oct. 19, 2020.

European Search Report with regard to the Patent Application No. 20315275.6 completed Oct. 23, 2020.

English Abstract for FR3033969 retrieved on Espacenet on Jan. 19, 2021.

English Abstract for EP3065250 retrieved on Espacenet on Dec. 23, 2020.

English Abstract for CN110601723 retrieved on Espacenet on Dec. 23, 2020.

English Abstract for CN101983494 retrieved on Espacenet on Dec. 23, 2020.

English Abstract for CN1917433 retrieved on Espacenet on Dec. 23, 2020.

English Abstract for CN1725707 retrieved on Espacenet on Dec. 23, 2020.

English Description and Claims for KR200435020 retrieved on Espacenet on Dec. 23, 2020.

European Search Report with regard to EP Patent Application EP 18315010 completed Aug. 7, 2018.

English Abstract of KR100849920 retrieved on Espacenet on Apr. 23, 2019.

English Abstract of DE10112844 retrieved on Espacenet on Apr. 23, 2019.

Office Action with regard to the counterpart U.S. Appl. No. 16/396,854 dated Sep. 2, 2021.

* cited by examiner

SYSTEMS AND METHODS FOR ELECTRIC SYSTEMS MONITORING AND/OR FAILURE DETECTION

CROSS-REFERENCE

The present application claims priority from European Patent Application No. 20315274.9, filed on May 28, 2020 and from European Patent Application No. 20315275.6, filed on May 28, 2020, the disclosures of both of which being incorporated by reference herein in their entirety.

FIELD

The present technology relates to systems and methods for electric systems monitoring. In particular, systems and methods for electric system monitoring in a datacenter are disclosed.

BACKGROUND

Large-scale networks and datacenters used for cloud computing, search engines, and similar applications, typically include tens or hundreds of servers for load sharing and for redundancy. These networks need to be highly scalable, so there is a need to frequently add more servers to the network infrastructure.

Large-scale server networks and datacenters consume very large amounts of electric power and generate a lot of heat. Any manner of accurately monitoring power consumption and electric health of the different components of the network is desirable.

Smart-grid networks, namely networks supporting a two-way, dynamic information flow may be used to transmit information over power lines of an electric grid. However, the use of this type of network must be decided before its implementation. Indeed, the electric systems of the network must be configured, prior usage, to sense physical values and actively transmit data. Monitoring a network must be anticipated before its implementation. Therefore, smart-grid networks are usually implemented into newly built home, office, modem building structure or the like, and the conversion of large-scale networks already in use would be an extremely time-consuming and costly operation as each system of the electric grid would have to be disconnected from the electric grid, modified to be able to share information and connected back to the electric grid. Besides, limited bandwidth and data rate of smart-grid networks, limit a frequency of sampling information and/or a number of electric systems from which the information may be sampled.

Power distribution units are usually used in datacenters to distribute electric power to a plurality of servers. Some power distribution units are capable of sensing a power parameter related to a server connected to an outlet of said power distribution units. However, they usually need a dedicated network, such as a Wi-Fi or Ethernet connection, to communicate measured real-time electric system operating data.

Even though the recent developments identified above may provide benefits, improvements for real time and accurate monitoring on pre-existing large-scale networks and datacenters are still desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In particular, such shortcomings may comprise (1) inability to measure close to real-time electric consumption; (2) the need to implement and use a network (e.g., distinct from a physical power line) dedicated to transmitting electric system operating data; and/or (3) inability to locate electric failures that may happen in the electric grid with enough accuracy.

In one aspect, various implementations of the present technology provide a system for monitoring electric systems of a datacenter, the system comprising:
  a plurality of power distribution units (PDUs), each of the plurality of PDUs comprising an electric power inlet, a plurality of electric power outlets and a memory, each of the plurality of PDUs being configured to:
    receive electric power from a power link connected to the electric power inlet;
    distribute electric power to the electric systems of the datacenter connected to the plurality of electric power outlets;
    sense one or more power parameters relating to each of the electric power outlets;
    generate electric system operating data from the one or more power parameters;
    store the electric system operating data in the memory;
    upon receipt of a request to transmit electric system operating data, transmit, via a first data link, at least a portion of the electric system operating data stored in the memory;
  a plurality of communicating circuit-breakers connected to the plurality of PDUs by the power link, each of the plurality of communicating circuit-breaker comprising an electric switch configured to emit a status signal when a fault condition is detected or when the switch is reset to resume normal operation;
  a networking device communicably connected to the plurality of PDUs via the first data link and connected to the plurality of communicating circuit-breakers via a second data link, the second data link being distinct from the first data link, the networking device being configured to:
    send requests to transmit the electric system operating data;
    receive the electric system operating data;
    receive the status signal from the plurality of communicating circuit-breakers; and
    detect an electric system failure based on the electric system operating data and the status signal.

In some implementations of the present technology, each of the plurality of PDUs comprises a processing unit communicably connected to the plurality of electric power outlets and configured to:
  receive the one or more power parameters,
  emits a disabling signal when the one or more power parameters exceeds a configurable power threshold;
  each of the plurality of electric power outlets comprising:
  a first relay selectively connecting the electric power outlet to a source of AC power, the first relay being responsive to the disabling signal to disconnect the electric power outlet from the source of AC power;

a first detector configured to:

receive the one or more power parameters, and emits the disabling signal when the one or more power parameters exceeds a fixed power limit;

a combining logic configured to maintain the disabling signal once emitted until it receives a rearm signal.

In some implementations of the present technology, the processing unit is further configured to, upon receipt of a command from the networking device, emit a disabling signal or a rearm signal.

In some implementations of the present technology, the electric system operating data generated by one of the plurality of PDUs and relating to the one or more power parameters of one of the plurality electric power outlets of the one of the plurality of PDUs are associated with the corresponding electric power outlet and the corresponding PDU.

In some implementations of the present technology, each of the plurality of PDUs and each of the plurality of communicating circuit-breakers is associated with an individual network address.

In some implementations of the present technology, the electric system operating data generated by one of the plurality of PDUs and relating to the one or more power parameters of one of the electric power outlets of the one of the plurality of PDUs, is associated with the corresponding electric power outlet and is associated with the individual network address of the corresponding PDU.

In some implementations of the present technology, the status signal emitted by one of the communicating circuit-breakers is associated with the individual network address of the corresponding communicating circuit-breaker.

In some implementations of the present technology, the networking device is further configured to:

detect an electric failure based on the electric system operating data;

determine a first individual network address associated with the occurrence of the electric failure; and send a command addressed to the first individual network address associated with the electric failure.

In some implementations of the present technology, the system comprises a plurality of power supply converters, each of the power supply converters receiving power from one of the plurality of PDUs and providing power to one of the electric systems of the datacenter.

In some implementations of the present technology, the system comprises a plurality of power supply converters, each of the power supply converters receiving power from one of the plurality of PDUs and providing power to a plurality of electric systems of the datacenter.

In some implementations of the present technology, the networking device is further configured to detect an electric failure of a server or a power supply converter relating to one of the plurality of PDUs based on the electric system operating data received from said PDU and relating to each electric power outlet of said PDU.

In some implementations of the present technology, the networking device sends the request to the plurality of PDUs simultaneously.

In some implementations of the present technology, the networking device sends the request to the plurality of PDUs sequentially, each request being addressed to a distinct PDU.

In some implementations of the present technology, wherein the networking device mediates data transmission in a Personal Area Network.

In some implementations of the present technology, the data link is a power line communication (PLC) protocol over a power line.

In some implementations of the present technology, generating the electric system operating data from the one or more power parameters comprises calculating, for each of the plurality of electric power outlets of a given PDU, an average value of a first period of time, a minimal value over the first period of time and a maximal value over the first period of time.

According to another aspect of the present technology, there is provided a method for detecting an electric failure in a datacenter. The method includes: sensing one or more power parameters relating to each of the electric power outlets of a power distribution unit (PDU); generating electric system operating data from the one or more power parameters relating to each electric power outlet, the electric system operating data being associated with its corresponding electric power outlet and corresponding PDU; storing the electric system operating data in a memory of the PDU; transmitting, upon receipt of a request, from the PDU to a remote device, via a first data link, at least a portion of the electric system operating data stored in the memory, the first data link being a power line communication (PLC) protocol operated over a power line, the power line providing electric power to the PDU; transmitting status signals from a communicating circuit-breaker to the remote device via a second data link, the second data link being distinct from the first data link, the communicating circuit-breaker being connected to the PDU via the power link; processing the electric system operating data associated with its corresponding power outlet and the PDU and the status signals to detect and locate an electric failure, the location of the electric failure being associated with the PDU one of the electric power outlet of the PDU or the communicating circuit-breaker.

In some embodiments, the method also includes, subsequent to processing the electric system operating data and the status signals, emitting a command from the networking device to the PDU; emitting a disabling or rearming signal by a processing unit of the PDU according to the command; disconnecting one or more of the plurality of outlets from a source of AC power upon emission of a disabling signal; connecting one or more of the plurality of outlets from the source of AC power upon emission of a rearming signal.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1:
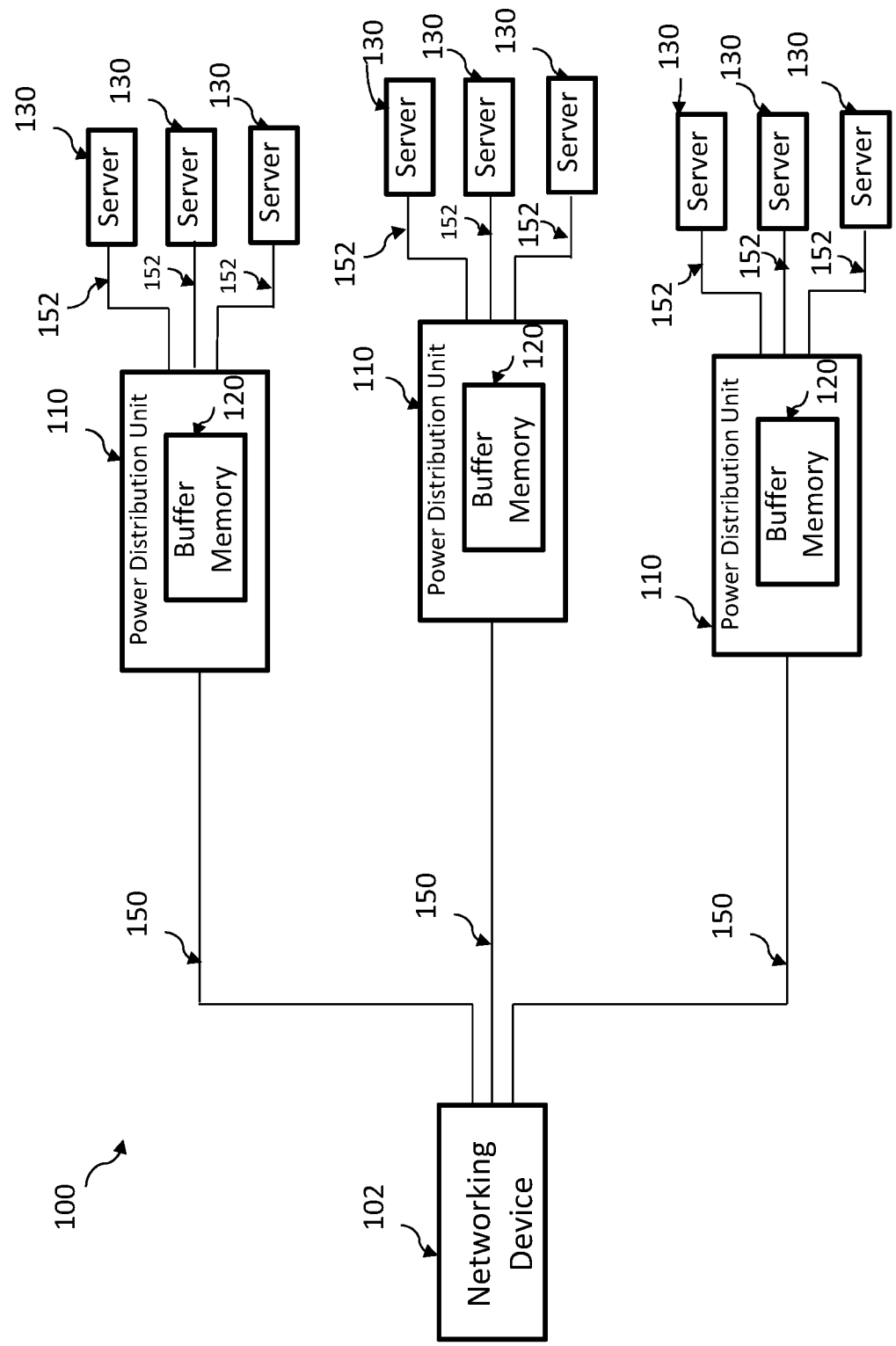
FIG. 1 is a diagram of a system for monitoring electric systems of a datacenter in accordance with an embodiment of the present technology.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudocode, and the like represent various processes that may be substantially represented in non-transitory computer-readable media and so executed by a computer or processor, whether or not such computer or processor is explicitly shown.

The functions of the various elements shown in the figures, including any functional block labeled as a "processor", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown. Moreover, it should be understood that module may include for example, but without being limitative, computer program logic, computer program instructions, software, stack, firmware, hardware circuitry or a combination thereof which provides the required capabilities.

With these fundamentals in place, we will now consider some non-limiting examples to illustrate various implementations of aspects of the present technology.

Various aspects of the present disclosure generally address one or more of the problems found in conventional electric systems of a datacenter monitoring systems. To this end, the present disclosure, amongst other aspects, introduces a system that provides a networking device communicably connected to a plurality of PDUs via a datalink, the PDUs being configured to sense one or more electric power parameters of a plurality of electric systems, that may be servers, of a datacenter connected to a plurality of outlets of said PDUs. The networking device may mediate data transmission in a Personal Area Network or the like.

Electric system operating data relating to the one or more power parameters of each of the electric power outlets calculated therefrom by a processing unit of each of the power distribution units are stored in a temporary buffer memory located in each of the power distribution units. Upon receipt of a request, at least a portion of the electric system operating data is transmitted to a networking device of a system via a data link.

In one embodiment of the present technology, the electric system operating data generated by one PDU and relating to one electric power outlet of said PDU are associated with the corresponding PDU and the corresponding electric power outlet of said PDU.

In one embodiment of the present technology, each of the plurality of PDUs is associated with an individual network address, the electric system operating data send by one PDU may be associated with the individual network address of said PDU and the associated electric power outlet of said PDU.

In one embodiment of the present technology, the one or more power parameters are sampled with a close to real-time rate adapted to the limited bandwidth and the maximum data rate of the datalink and the number of systems to monitor in the datacenter. At least two requests for the electric system operating data are sent by a networking device through the datalink during the storage duration of the electric system operating data in the temporary buffer memory of the plurality of the power distribution units. Upon request, the electric system operating data is sent from the temporary buffer memories of the plurality of power distribution units to a networking device via the datalink. The datalink may be operated over the power line, using for example a power line communication (PLC) protocol.

While the present technology is described in the context of operations of datacenters, it should be understood that this aspect is not limitative. To the contrary, in some embodiments, the present technology may be deployed in the context of monitoring and/or locating failure of electric systems in various contexts.

FIG. 1 is a diagram of a system 100 for monitoring electric systems of a datacenter in accordance with an embodiment of the present technology. The system comprises a plurality of power distribution units (PDUs) 110', each of the plurality of power distribution units comprising a temporary buffer memory 120'. Without limitations, the plurality of electric systems 130' of the datacenter may be servers, each electric system 130 being connected to one electric power outlet of one of the plurality of PDUs 110' via a power link 152. The plurality of PDUs 110' are linked to a networking device 102 and a source of power (not shown) via power lines 150. Although three PDUs and nine servers are represented on FIG. 1, the system 100 may include different number of PDUs and servers. This aspect is not limitative.

Each electric power outlet of each of the plurality of PDU comprises an output circuit. The output circuits are configured to sense one or more power parameters related to their corresponding electric power outlet. For each electric power outlet, electric system operating data is generated therefrom to assess the electric health of the electric system connected to said electric power outlet. Electric system operating data generation will be described hereinafter.

In one embodiment of the present technology, the electric system operating data generation relating to one specific electric power outlet comprises calculation of an average value of electric power consumption over a certain period of time, a minimal value of electric power consumption over the certain period of time and a maximal value of electric power consumption over the certain period of time.

The temporary buffer memory 120 of each PDU 110 is configured to store electric system operating data calculated from the one or more power parameters and relating to each electric power outlet of the corresponding PDU 110. The output circuits and the storage operation of electric system operating data will be further described hereinafter.

As a non-limitative example and an aid to understanding, FIG. 1 describes a system 100 for monitoring electric systems of a datacenter where each PDU 110 senses one or more power parameters relating to three electric systems 130 and stores the relating electric system operating data generated therefrom in their corresponding temporary buffer memory 120. Again, this is merely done as an aid to understanding, and not to define the scope or set forth the bounds of the present technology.

Upon request from the networking device 102 to one of the PDUs 110, electric system operating data is sent from the temporary buffer memory the PDU 110 to the networking device via a datalink (not shown). This datalink may be operated over the power lines 150, for example via a power line communication (PLC) protocol. The maximum data rate for communications over power line is known to be lower than data rates of other types of network such as IP network. As an example, data rates associated with the PLC may typically range from 4 kb/s to more than 100 kb/s. Besides, PLC communications are known to be prone to electrical noise interferences, that can lead to data losses. The present technology aims at mitigating the drawbacks of datalinks operated on power lines while providing a close to real time and reliable monitoring of operations data and/or detection of failures of electrical systems. The present technology further aims at avoiding deploying a dedicated communication network (e.g., to collect data from the PDUs) which would be costly and cumbersome to deploy at large scale, such as within datacenters.

Figure 2:
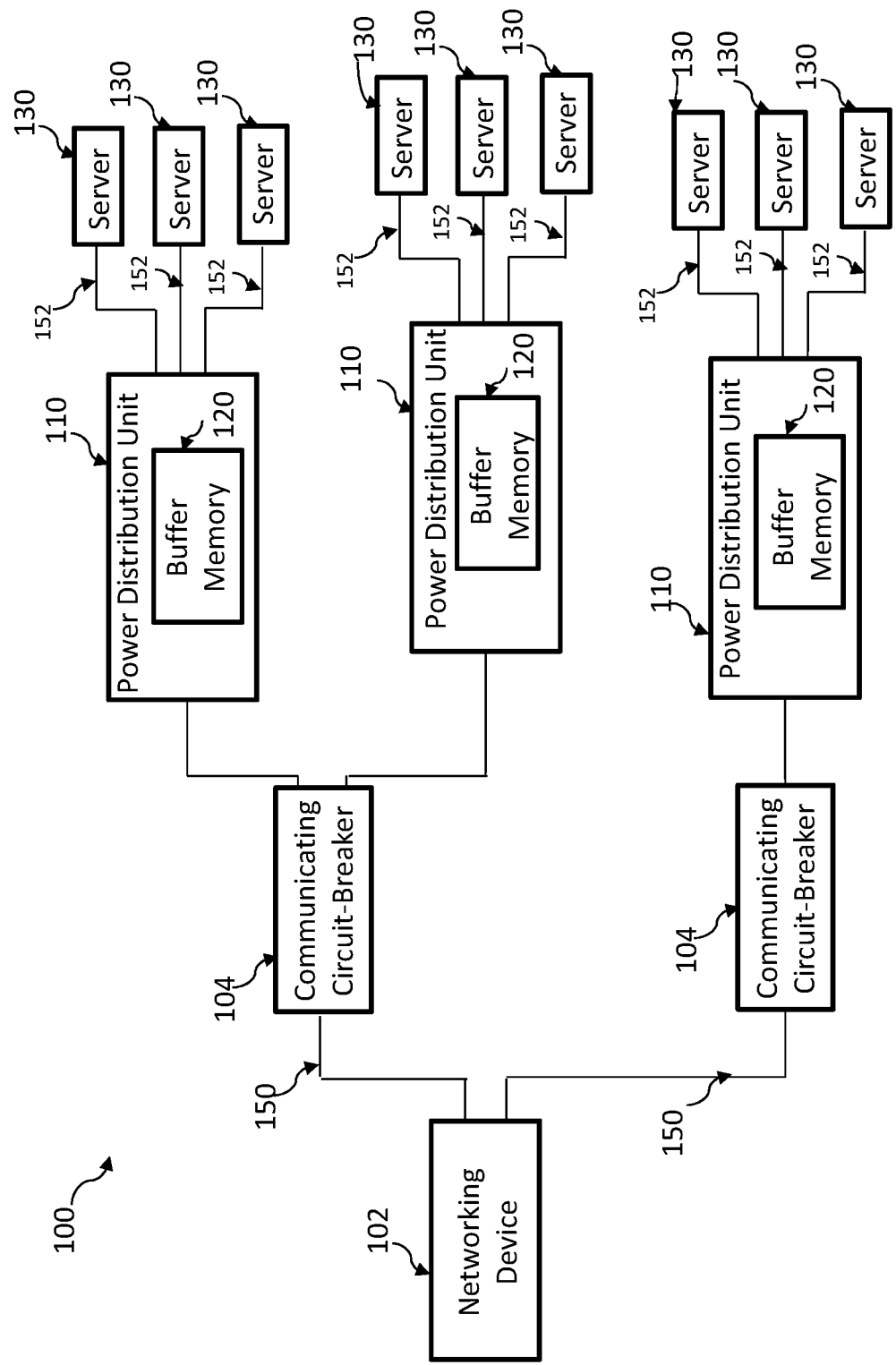
FIG. 2 is another diagram of a system for monitoring electric systems of a datacenter in accordance with another embodiment of the present technology.

FIG. 2 is another diagram of system 100 in accordance with an embodiment of the present technology. FIG. 2 provides an alternative embodiment of the system 100 introduced in the foregoing description of FIG. 1. Communicating circuit-breakers 104 are connected to the networking device 102, each one of the communicating circuit-breakers being connected to at least one PDU 110 via power links and comprising an internal electric switch. The communicating circuit-breakers 104 communicably connected to the networking device 102 via a second network (not shown) and configured to transmit a signal status, relating to the electric status of their internal electric switch, to the networking device 102 over said dedicated network. In some embodiments, the second network is distinct from the datalink operated on the power lines. Given the lower number of communicating circuit-breaker compared to the number of PDUs deployed in a typical datacenter, installing a dedicated communication mean for the communicating circuit-breaker proves to be an acceptable compromise. The features of the communicating circuit-breakers are described with more details hereafter.

In one embodiment of the present technology, the status signal emitted by each communicating circuit-breaker is associated with its corresponding communicating circuit-breaker.

In one embodiment of the present technology, each of the plurality of communicating circuit-breakers 104 is associated with an individual network address, the status signals send by one communicating circuit-breaker 104 may be associated with the individual network address of said communicating circuit-breaker 104.

Figure 3A:
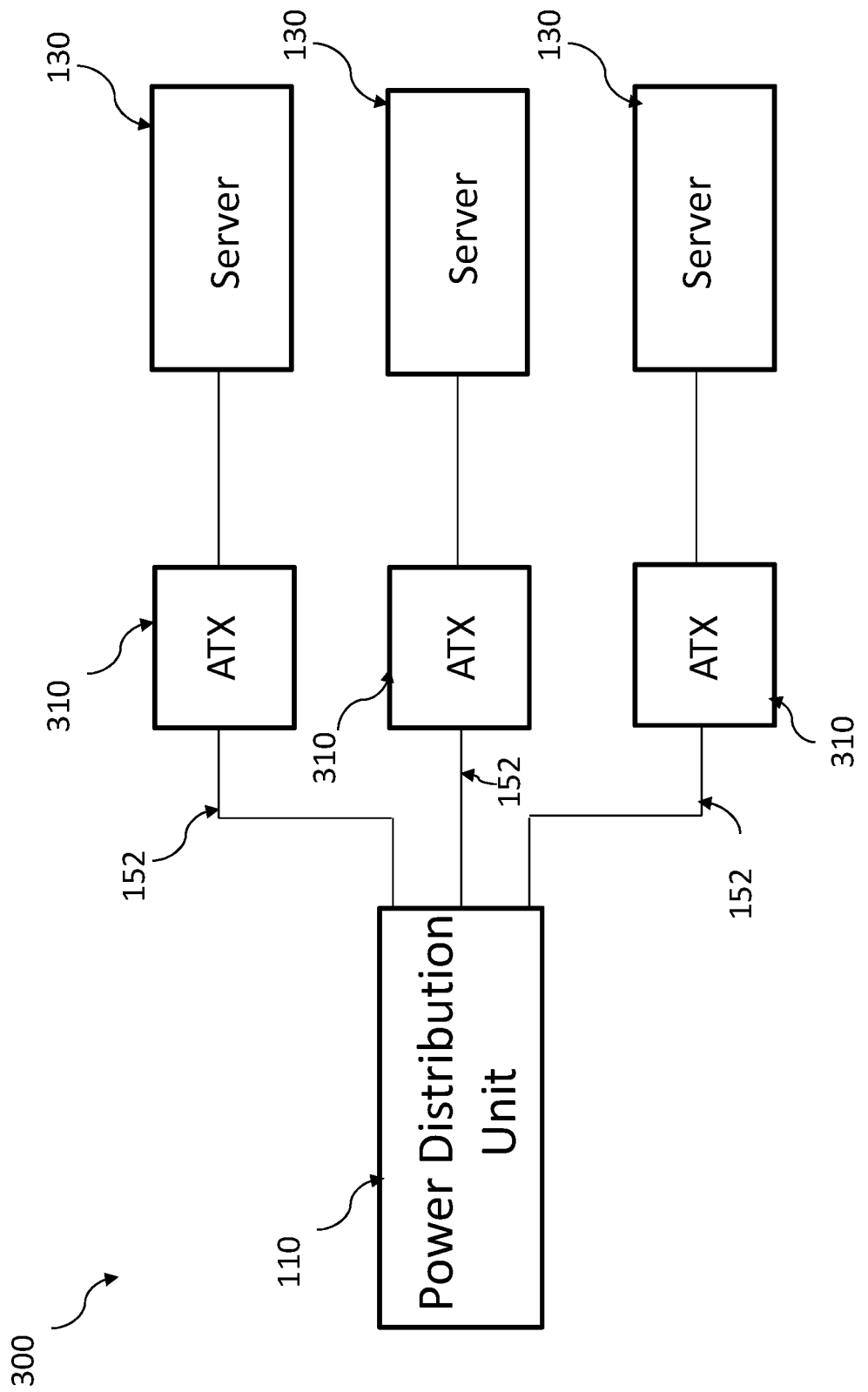
FIGS. 3A and 3B are diagrams of connections between components of a datacenter in accordance with an embodiment of the present technology.
Figure 3B:
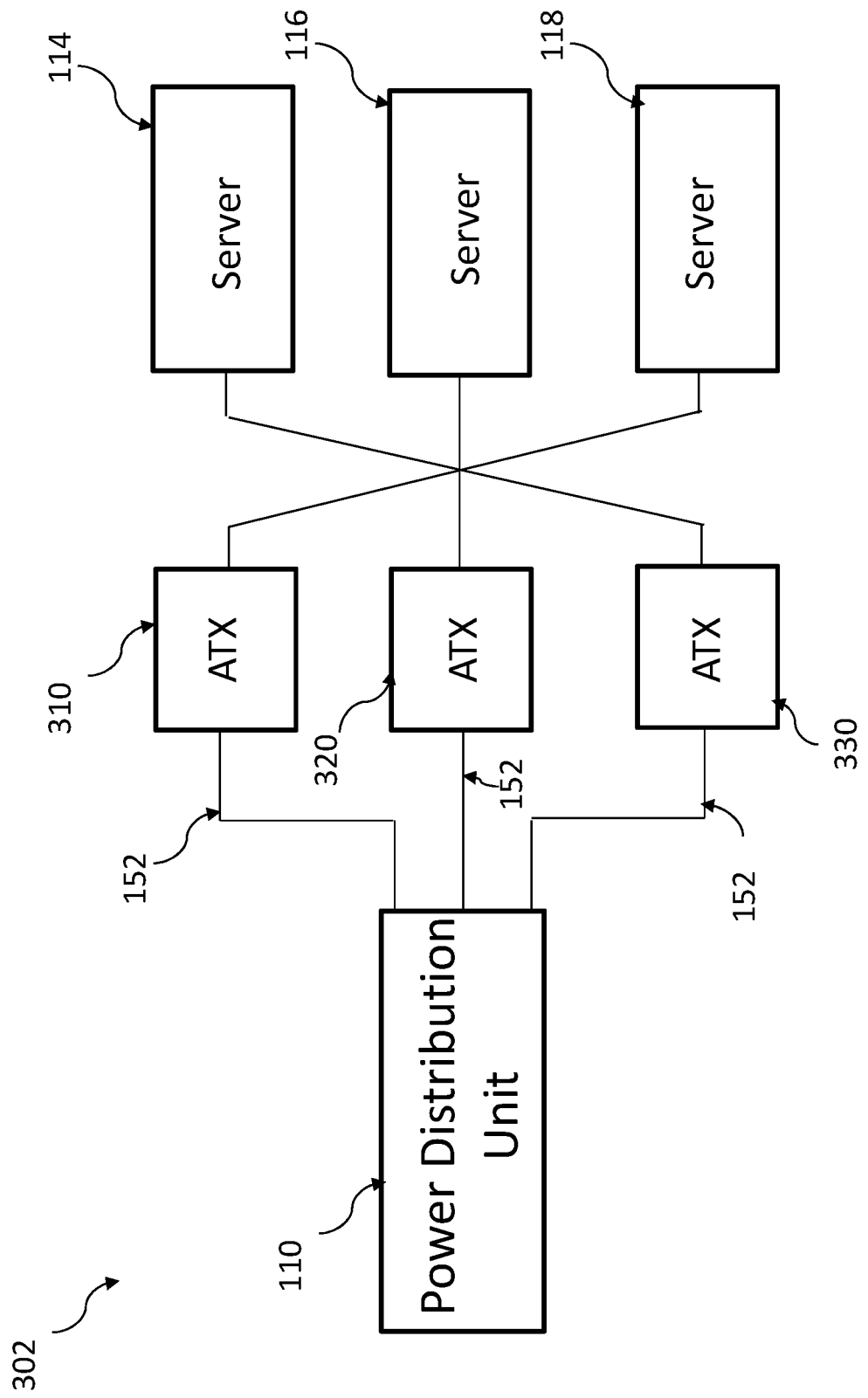

FIGS. 3A and 3B are diagrams of connections between components of a datacenter in accordance with an embodiment of the present technology. As illustrated in FIG. 3A, the servers of a datacenter are usually connected to a power supply converter before being connected to a power distribution unit, each server 130 being connected to one power supply converter 310 and the power supply converters 310 being connected to the power distribution unit 110. Although three servers 130 and their corresponding power supply converters 310 are represented on FIG. 3A, each PDU of the system 100 may be connected to a different number of power supply converters and servers. Without limitations, the power supply converters 310 of the shown embodiment may be compliant with the ATX power supply standards. Indeed, many devices such as servers in datacenters need to receive power at more than one voltage. ATX has become a de facto industry standard for powering servers at 12 volts DC, 3.3 volts DC and 5 volts DC. For example and without limitation, electronic equipment may consume power at 5 volts and cooling fans may consume power at 12 volts.

A processing unit, such as a Raspberry™ or other MicroChip™ microcontroller, of the PDU 110 is configured to generate electric system operating data based on the sensing of the one or more power parameters for each of the plurality of electric power outlets, each electric power outlet corresponding to a combination of one power supply converter 310 and one server 130. The electric system operating data may comprise the actual electric consumption of each of the plurality of electric power outlets of PDU 110. The details of a detection sub-circuit of each of the outlets of the PDU 110 are described in a later Figure. Multiple PDUs of the datacenter may be identical to PDU 110.

With reference to the alternative electric configuration of FIG. 3B, each of the plurality of the servers 130 is connected to a plurality of power supply converters 310, in accordance with one embodiment of the present technology. The diagram of FIG. 3B is a mere example of the numerous possible configurations, where the three servers 130 are connected to the three power supply converters 310. The connection of a server to a plurality of power supply converters 310 finds its utility in redundancy. Indeed, if an electric failure occurs on one power supply converter, the other power supply converters can compensate for the power delivered to the servers that are connected to the failing power converter. Besides, this configuration allows the processing unit of the PDU to determine if the electric failure happened on one power supply converter 310 or on one server 130, as opposed to the configuration illustrated in FIG. 3A. In the case of a failing server 130, a plurality of power converters 310 would be impacted, leading to a plurality of unusual identical power parameter measurements on a plurality of electric power outlets of the power distribution unit. In the case of a failing power supply converter, the power parameter measurement of the corresponding outlets of the PDU, with no similar power parameter measurement of other electric power outlets would be an indication of a failure of a power supply converter.

Referencing simultaneously to FIGS. 1-3, the PDU 110 stores electric system operating data in its temporary buffer memory and, upon receipt of a request, send at least a portion of the electric system operating data via a data link that may be operated over the power line 150, for instance with the use of a power line communication (PLC) protocol, to the networking device where the electric system operating data can be processed by an operator or a technician of the datacenter. In case of failures associated with a plurality of electric power outlets of a specific PDU, or in the case where no electric system operating data is received from a PDU, the technician could easily infer that an electric failure occurred in the corresponding PDU.

As described therebefore, the connection illustrated on FIG. 3B allows the technician to detect an electric failure either on a certain server, on a certain power supply converter, or on a single PDU. The signals status sent by the communicating circuit-breakers 104 allow the technician to detect an electric failure on a group of PDUs as well, as a communicating circuit-breaker is usually connected to a plurality of PDUs. The system herein described allows a technician of the datacenter to detect on which server, or on which power supply converter, or which power distribution unit, or which group of power distribution units an electric failure occurred.

Figure 4:
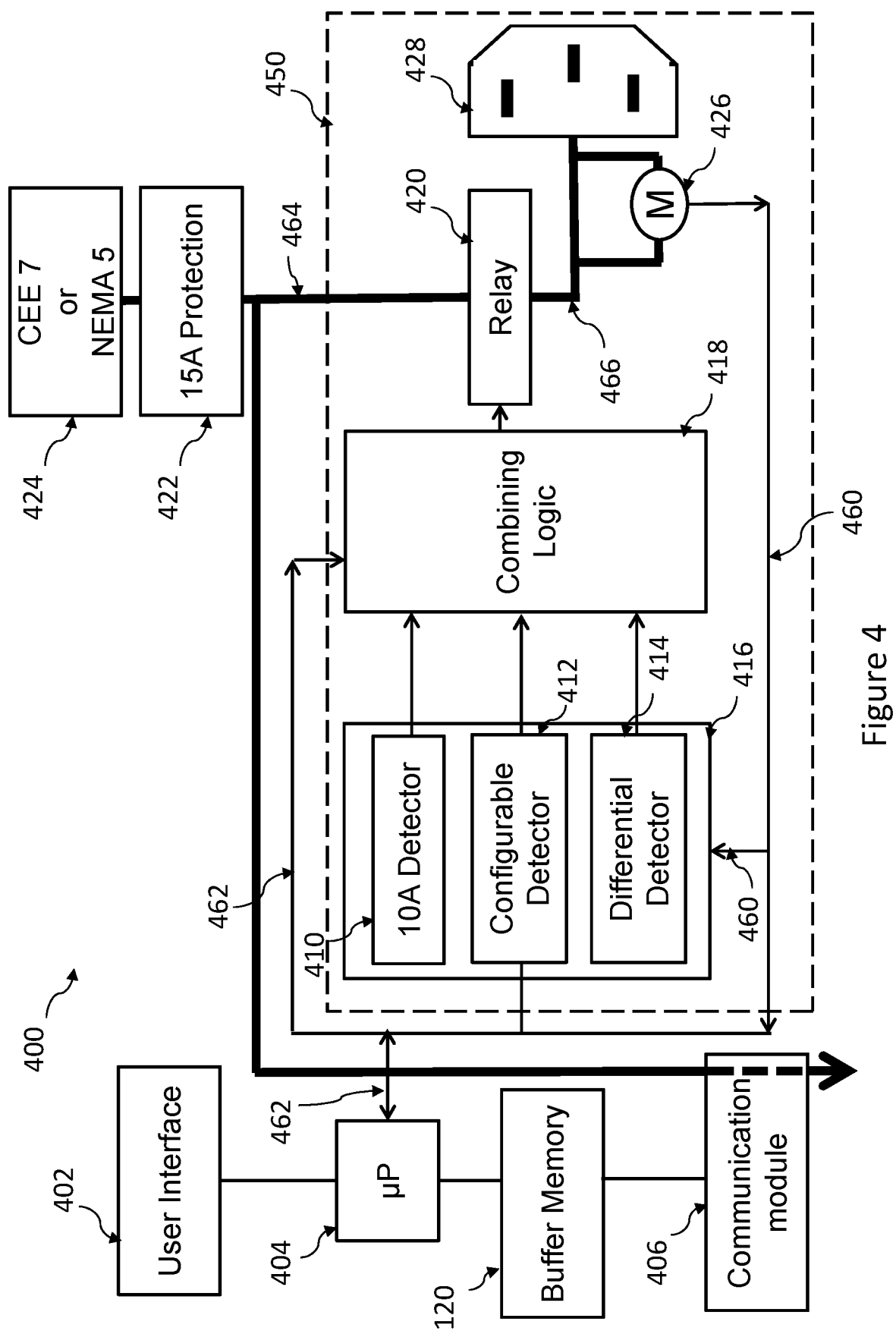
FIG. 4 is a high-level schematic diagram of an AC smart fuse in accordance with an embodiment of the present technology.

FIG. 4 is a high-level schematic diagram of an AC smart fuse in accordance with an embodiment of the present technology. Without limitation, the AC smart fuse may be integrated in a power distribution unit (PDU) 110. In the illustrated embodiment, the PDU 110 includes an electric power inlet 424, for example a CEE 7-type plug for use in European countries or a National Electrical Manufacturers Association (NEMA) 5-type plug for use in North American countries, and one or more electric power outlets, each electric power outlet of the PDU 110 being adapted to be connected to a server or a power supply converter of a server. In order to lighten the following description, both cases will be described as if only a server would be connected for each electric power outlet of the PDU 110. The electric power inlet 424 is adapted for connecting the PDU 110 to a source of AC power (not shown), also called a sector or a grid via a power line 150 as illustrated in FIG. 1. The PDU 110 is protected against overcurrent by a fixed protection 422, for example a 15-ampere circuit breaker. Each electric power outlet comprises an output circuit 450. A power line 464 connects the electric power inlet 424 to each of the output circuits 450. Each of the output circuits 450 comprises an output connector 428 adapted for connecting the output circuit 450 to a server, for example a C13-type plug, connected in series to the electric power inlet 424 via the power line 464, a relay 420, and an internal power line 466. The relay 420 selectively connects the output connector 428 to the source of AC power via the electric power inlet 424. Each output circuit 450 comprises a detection sub-circuit 416 that protects the output connector 428 by controlling the relay 420. The detection sub-circuit 416 includes a fixed detector 410 adapted to apply a fixed power limit of the output circuit 450 and a configurable detector 412 adapted to apply a configurable power threshold of the output circuit 450. The fixed power limit is greater than a maximum value for the configurable power threshold. The fixed detector 410 may emit a first fault signal when a sensed power level exceeds the fixed power limit and the configurable detector 412 may emit a second fault signal when the sensed power level exceeds the configurable power threshold.

In an embodiment, the fixed detector 410 is adapted to enforce a fixed high-level current limit, for example 10 amperes, and the configurable detector 412 is adapted to enforce a definable current set point. In the same or another embodiment, a differential detector 414 compares a load current flowing from the output connector 428 to the server and a neutral current returning to the output connector 428 from the server in order to detect any ground fault at the server. The differential detector 414 may emit a third fault signal when a difference between current flowing from the output connector 428 to the server and a neutral current returning to the output connector 428 from the server exceeds a maximum differential current set-point. Any one of the fixed detector 410, the configurable detector 412 and the differential detector 414 may thus issue a fault signal to cause a combining logic 418 to generate a disabling signal. The disabling signal, in turn, causes the relay 420 to adopt a non-conducting position, causing the output connector 428 and the server to become disconnected from the electric power inlet 424 and thus from the source of AC power. The combining logic 418 maintains the disabling signal, once set, until it receives a rearm signal. In the output circuit 450, a sensor 426 senses a level of power delivered to the server via the output connector 428. In an embodiment, the sensor 426 measures the load current flowing from the output connector 428 toward the server and the neutral current returning from the server to the output connector 428. Use of other types of sensors, for example a voltmeter, an ammeter, a power meter and a combination thereof, is also contemplated. The sensor 426 provides one or more power parameters 460 to the detection sub-circuit 416.

The PDU 110 also comprises a processing unit 404, for example a microprocessor (μP), operatively connected to the detection sub-circuit 416, to the combining logic 418, to a temporary buffer memory 120 and to the sensor 426 of each output circuit 450 via an internal bus 462. In the same or another embodiment, the processing unit 404 receives the one or more power parameters 460 to generate electric system operating data relating to each electric power outlet of the PDU, the one or more power parameters 460 being selected from a voltage, a current, an effective current, an instantaneous power level, an instantaneous active power, an instantaneous reactive power, a phase angle of the voltage relative to the current or a combination thereof.

As illustrated, current flows from the electric power inlet 424 and the fixed protection 422 via the power line 464 through the relay 420 before its measurement by the sensor 426. However, in accordance with one embodiment, the current may flow through the sensor 426 before reaching the relay 420. FIG. 4 is therefore highly schematic and is intended to provide a conceptual view of some aspects of the present technology.

The processing unit 404 is further configured to provide signals, also via the internal bus 462, to define the set point of the configurable detector 412 of the detection sub-circuit 416. The processing unit 404 may also send, upon receipt of a command, a rearm signal allowing the combining logic 418 to release the disabling signal 36 or a disabling signal allowing the combining logic 418 to release the disabling signal 36.

The measurements of the one or more power parameters and generation of the electric system operating data calculated therefrom will be further described hereinafter.

A communication module 406 allows the processing unit 404 to communicate with the networking device 102 or other devices, for example to a remote processing unit (not shown) or to processing units of other PDUs, via the power line 464, using for example a power line communication (PLC) protocol. A user interface 402 allows a user of the PDU 110 to communicate with the processing unit 404. The user interface 402 is not necessarily part of the PDU 110 but may be connected thereto via a communication link.

In one embodiment of the present technology, the PDU 110 includes one (1) electric power inlet 424, one processing unit 404, and eight (8) distinct output circuits 450, each of which includes its own output connector 428, detection sub-circuit 416, combining logic 418 and sensor 426. In the same or another embodiment, the electric power inlet 424 with the fixed protection 422 can deliver up to 15 amperes to the output circuits 450. The processing unit 404 may control each distinct configurable detector 412 so that a collective load current delivered by all output circuits 450 of the PDU 110 does not exceed a maximum limit, for example the 15-ampere limit of the fixed protection 422.

In one embodiment of the present technology, the detection sub-circuit 416 of the AC smart fuse of each of the plurality of outlets of the PDU senses one or more power parameters selected from a voltage, a current, a power level, an effective current, an instantaneous power, an instantaneous active power, an instantaneous reactive power, a phase angle of the voltage relative to the current, and a combination thereof from the plurality of servers of the datacenter. Therefore, actual increases and decreases of electric consumption of each server connected to the PDU can be measured.

Figure 5:
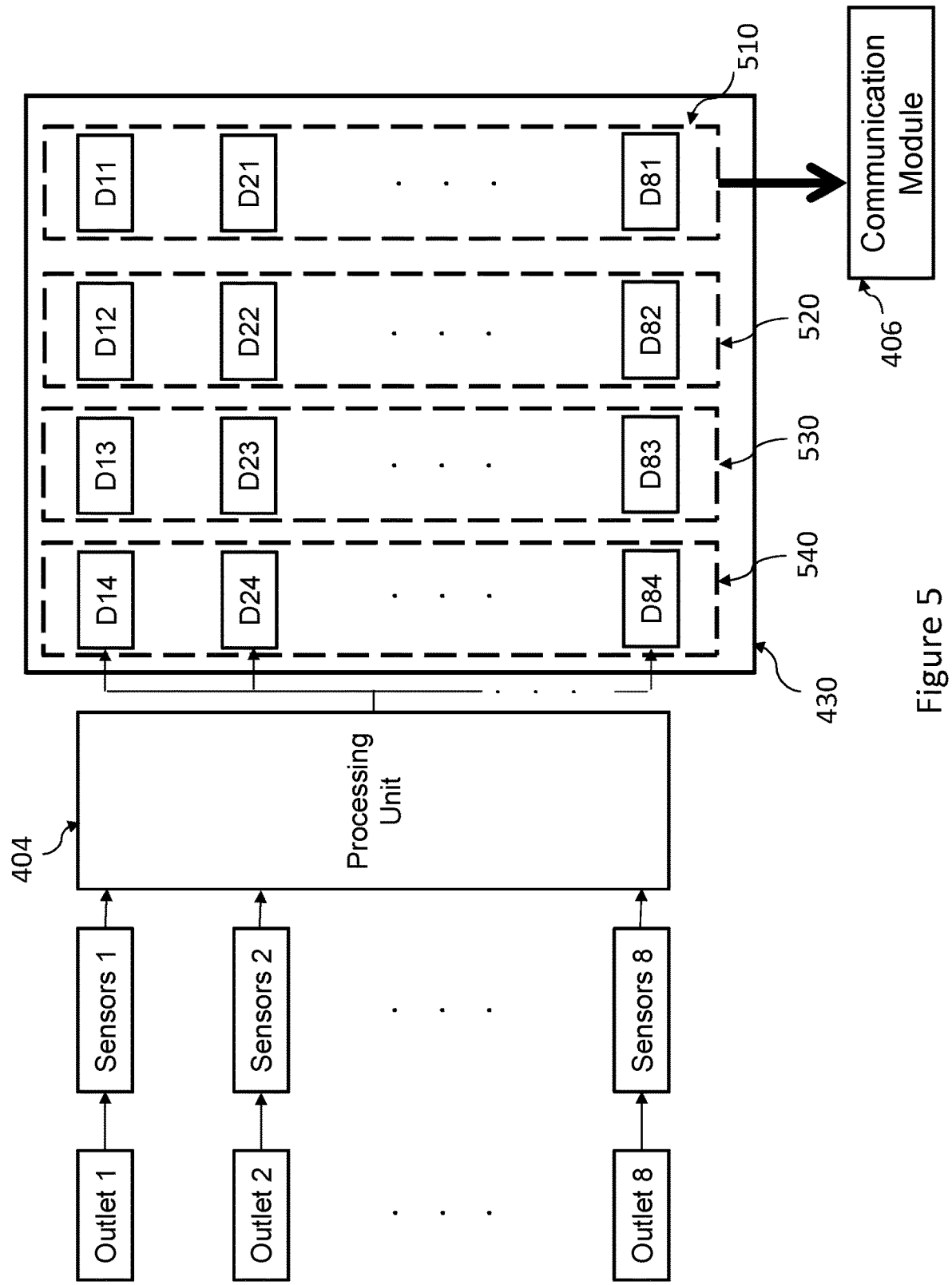
FIG. 5 is a diagram showing electric system operating data generation occurring in a power distribution unit in accordance with one embodiment of the present technology.

FIG. 5 is a diagram showing electric system operating data generation in one power distribution unit in accordance with one embodiment of the present technology. In this illustrative embodiment, the power distribution unit comprises eight (8) electric power outlets. The one or more power parameters of each electric power outlets is sampled at a first rate by the detection sub-circuits previously described in FIG. 4, the time period relating to the first rate being further referenced to as T1. As an example and without being limitative, the time period T1 may vary from 0.5 milliseconds to 4 milliseconds.

The processing unit 404 is configured to collect values of the one or more power parameters measured related to each electric power outlet simultaneously in a local memory (not shown) and generate electric system operating data relating to each electric power outlet of the PDU. The generation of the electric system operating data may be periodical, the relating time period is further referenced to as T2. In one embodiment of the present technology, T2 is higher than T1. As an example and without being limitative, T2 may vary from 5 seconds to 60 seconds. In the same or another embodiment, the electric system operating data generation comprises a calculation of a triplet of values for each of the plurality of electric power outlets of a given PDU, each triplets of values comprising an average value of the electric power consumption over a period of time equaling T2, a minimal value of the electric power consumption over a period of time equaling T2 and a maximal value of the electric power consumption over a period of time equaling T2 simultaneously.

In the same or another embodiment, the bit size of the electric system operating data relating to one PDU is fixed and independent from the period of time T2 as it only contains triplets of values relating to the electric power outlets of the one PDU, each triplet of values corresponding to one electric power outlet. The three values indicate the correct functioning of the system with real time accuracy as the sampling rate 1/T1 allows the system to detect a sharp increase or decrease of the electric power consumption of electric power outlets that may be symptomatic of an unusual functioning of a server or a power supply converter. As an example and without being limitative, the sampling rate 1/T1 may vary from 250 Hz to 2 kHz.

With respect to FIG. 5, the electric system operating data is generated by the processing unit 404 before being stored in the temporary buffer memory 120. In the illustrative embodiment, the electric system operating data is concatenated and stored as electric system operating data frames 510, 520, 530 and 540.

The temporary buffer memory 120 of each of the plurality of PDUs is configured to store the electric system operating data for a predefined storage duration. Alternatively, the temporary buffer memory 120 may not be constrained by a predefined storage duration but rather may operate as a FIFO buffer, wherein the data is processed in the same order it arrived in the FIFO buffer, and erase old data with new data periodically irrespectively of whether the data is transmitted to the networking device. Under such mode of operations, the temporary buffer is limited to storing the electric system operating data reflecting the past periods of operations which are then superseded with more recent data.

The electric system operating data frame 510 contains the electric system operating data D11 relating to a first electric power outlet and generated during a first period of time equaling T2, the electric system operating data D21 relating to a second electric power outlet and generated during a first period of time equaling T2, and similar electric system operating data relating to the other electric power outlets of the PDU. The electric system operating data frame 520 contains the electric system operating data D12 relating to the first electric power outlet and generated during a second period of time equaling T2 following the first period of time, the electric system operating data D21 relating to the second electric power outlet and generated during a second period of time equaling T2 following the first period of time, and similar electric system operating data relating to the other electric power outlets of the PDU. The electric system operating data frame 530 contains the electric system operating data D13 relating to the first electric power outlet and generated during a third period of time equaling T2 following the second period of time, the electric system operating data D21 relating to the second electric power outlet and generated during a third period of time equaling T2 following the second period of time, and similar electric system operating data relating to the other electric power outlets of the PDU. Following electric system operating data frames are structured in a similar manner.

Upon receipt of a request from the networking device 102, the communication module 406 sends at least one electric system operating data frame from the temporary buffer memory 120 of the PDU to the networking device 102 via the datalink. In one embodiment, a period of time between a first sending of a first request by the networking device to each of the plurality of PDUs and a second sending of a second request by the networking device to each of the plurality of PDUs is at least twice shorter than the storage duration of the electric system operating data in the temporary buffer memory.

Figure 6:
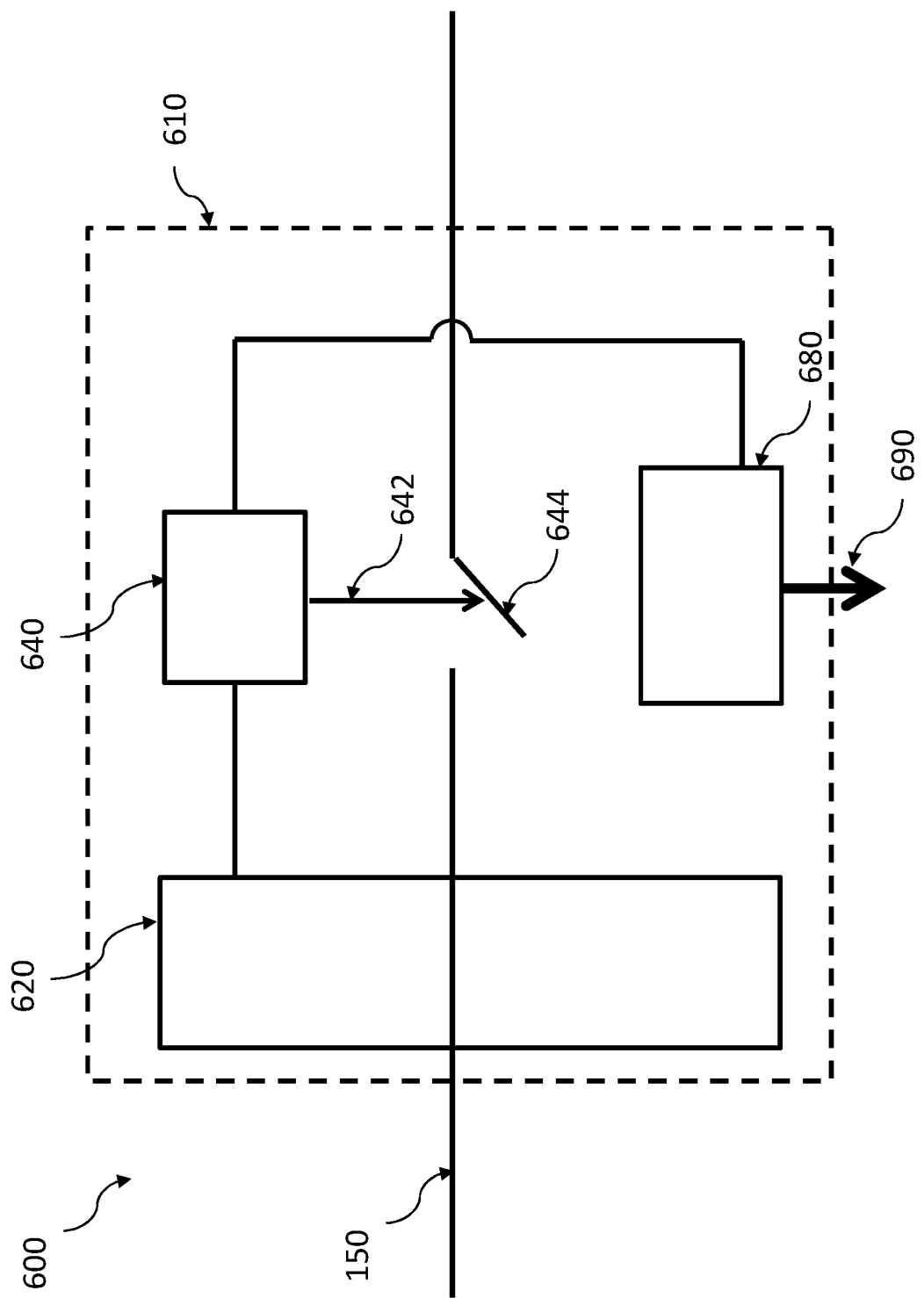
FIG. 6 is a diagram of a communicating circuit-breaker in accordance with one embodiment of the present technology.

FIG. 6 is a diagram of a communicating circuit-breaker in accordance with one embodiment of the present technology. Sensing sub-circuit 620 is configured to sense a power level of the power line 150. A detector 640 is communicably connected to the sensing sub-circuit 620 and may emit a fault signal when the sensed power level exceeds a fixed power limit or a rearming signal upon receipt of a command. Upon receipt of the fault signal, an actuator 642 open contacts of an internal electric switch 644 located on the power line 150 to protect power distribution units that may be connected to the communicating circuit-breaker. Upon receipt of a rearming signal, the actuator 642 connects the contacts of the internal electric switch 644.

A communication sub-circuit 680 is communicably connected to the actuator 642 and the networking device via a datalink 690. The communication sub-circuit is configured to send a status signal that indicates the state of the actuator to the networking device. Upon receipt of a command from the networking device over the datalink 690, the communication sub-circuit is further configured to emits a rearming signal to the actuator 642.

Figure 7:
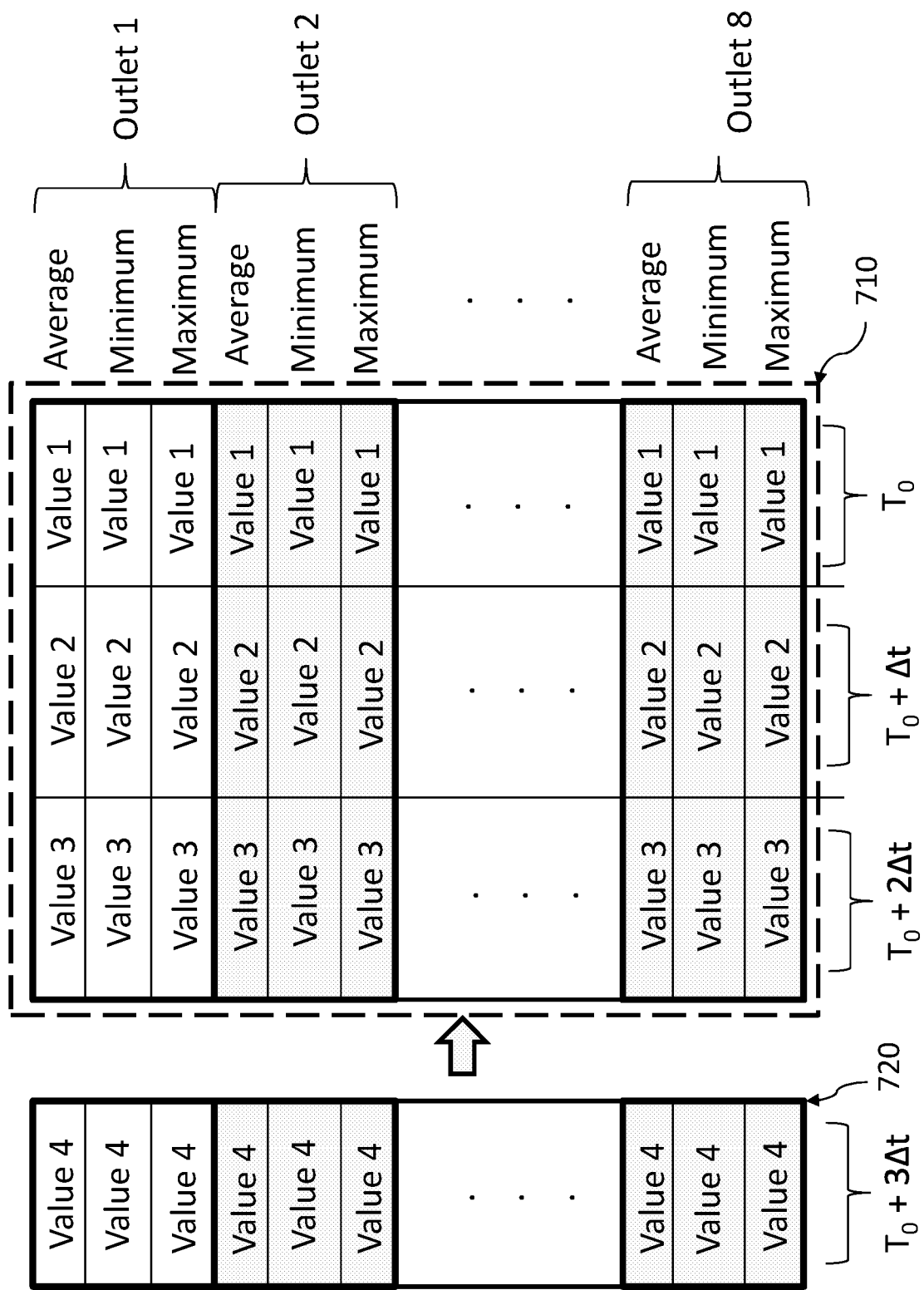
FIG. 7 is a diagram of electric system operating data being structured in a networking device in accordance with one embodiment of the present technology.

FIG. 7 is a diagram of electric system operating data structuring in the networking device in accordance with one embodiment of the present technology. The networking device comprises a memory 710 configured to store the electric system operating data upon receipt of the electric system operating data frames. In the illustrative embodiment, the networking device is communicably connected to one PDU (not shown). It should be understood that the networking device is configured to be communicably connected a plurality of PDUs. In the illustrative embodiment, each electric system data frame is structured as the electric system data frame 720. The electric system operating data frame 720 contains, for each of the electric power outlet of the PDU, a triplet of values, each triplet of values comprising the average value, the minimal value and the maximal value of the electric power consumption of the corresponding electric power outlet. In the illustrative embodiment, the triplet of values is calculated over a certain period of time $\Delta t$, the period of time $\Delta t$ being equal to the period of time between two successive generations of electric system operating data frame by the processing unit 404.

In the illustrative embodiment, the networking device sends a request to the PDU and receive an electric system data frame periodically, the period being equal to $\Delta t$. The networking device is therefore configured to render the temporal evolutions of the average value, the minimal value and the maximal of the electric power consumption of each of the electric power outlet of the PDU with a sampling period of $\Delta t$. As a result, the networking device may be said to build an historic of electric system operating data which is updated in a close to real-time manner. This approach allows monitoring of past and present electric system operating data and allows the conduct of analysis of such data alone or in combination with other data. The outcome of such analysis comprises monitoring of consumption, prediction of consumptions, detection and/or prediction of failures, etc.

As previously mentioned, the electric system operating data send from one PDU are associated with the individual network address of the corresponding PDU and the corresponding electric power outlet of said PDU. This allows an operator, among other possible operations, to access the temporal evolution of the triplet of values of a specific electric power outlet of a specific PDU with close to real time precision, as each value of the triplet of value is updated over a period of time equaling $\Delta t$ at a sampling rate of 1/T1 before being sent to the networking device 102.

Figure 8:
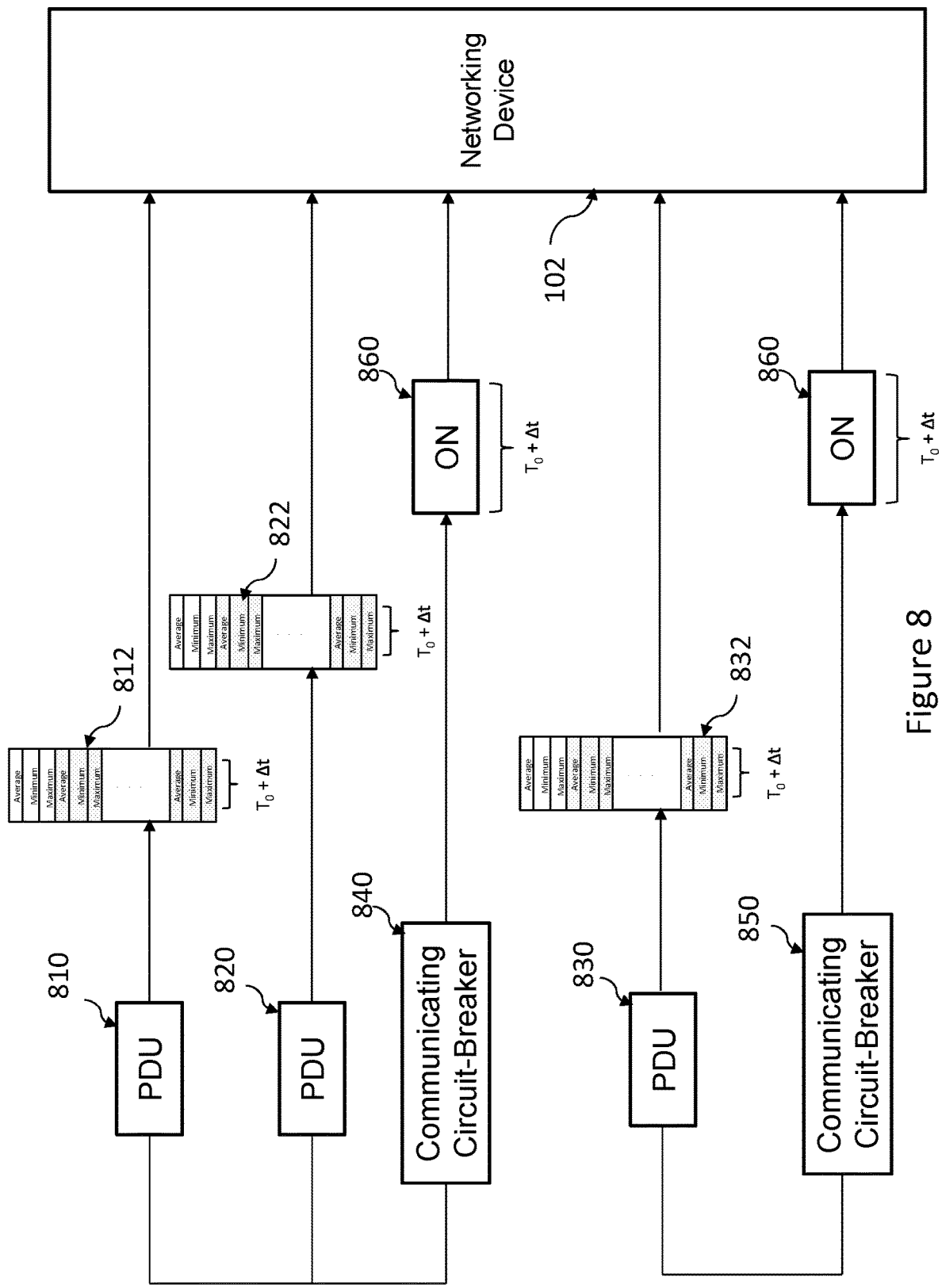
FIG. 8 is a diagram of electric system operating data and status signals communication in accordance with one embodiment of the present technology.

FIG. 8 is a diagram of electric system operating data and status signals communication in accordance with one embodiment of the present technology; The networking device 102 is communicably connected to the power distribution units 810, 820 and 830 and the communicating circuit-breakers 840 and 850. In this illustrative embodiment, the three PDUs send, upon receipt of a request from the networking device, electric system operating data relating to one or more power parameters of the plurality of their corresponding electric power outlets as electric system operating data frames 812, 822 and 832. Simultaneously, the electric status of the internal electric switch of the communicating circuit-breakers are communicated with the networking device 102 as status signals 860'. Although three PDUs and two communicating circuit-breakers are represented on FIG. 8, the networking device 102 may communicate with a different number of PDUs and communicating circuit-breakers. This aspect is not limitative.

The electric data frames 812, 822 and 832 are stored in the networking device memory as detailed in the description of FIG. 7. Status signals 860' are real time indications of the electric states of the communicating circuit-breakers 840 and 850 respectively.

Therefore, overconsumption of electric power of an electric power outlet a PDU, electric failure of a power supply converter or a server, electric failure of a PDU or a group of PDUs or a combination thereof can be detected based on the correlation between the electric system operating data and the status signal relating to each communicating circuit-breaker.

For instance, a temporal increase of the average value of the electric power consumption of one specific electric power outlet leading to overheating the connected server or power supply converter can be detected.

For instance, a temporal decrease of the electric power consumption of a plurality of electric power outlets of one specific PDU can be used to detect an electric failure of the PDU.

For instance, a temporal increase of the average value of the electric power consumption of a plurality of electric power outlets of a plurality of PDUs, each of the plurality of PDUs being connected to the same communicating circuit-breaker, may indicate a rise of a room temperature where the plurality of PDUs is located. This may lead to an upcoming emission of a fault signal by the associated communicating circuit-breaker which is usually located in the same room as the PDUs, as circuit-breaker are usually sensitive to the temperature.

Figure 9:
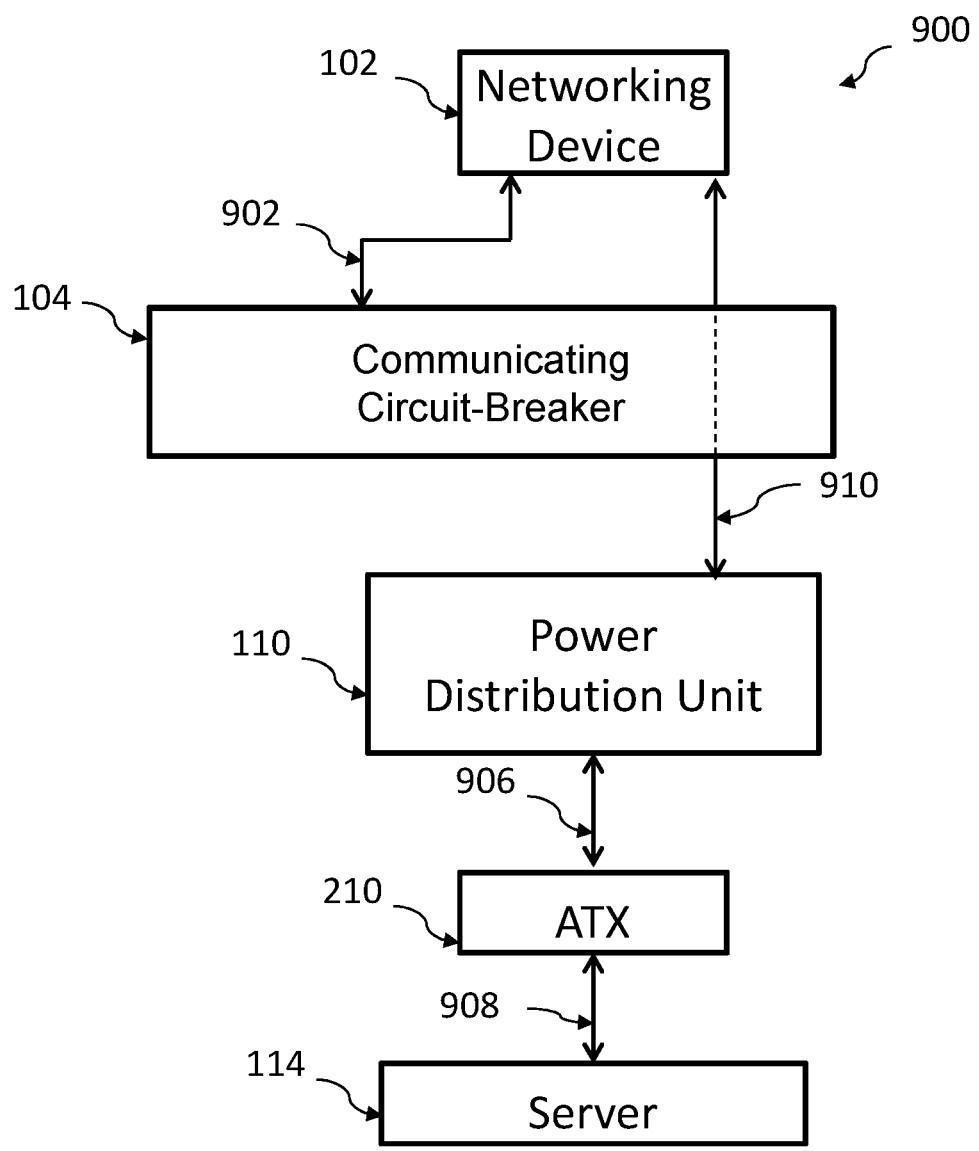
FIG. 9 is a diagram of communications between different components of a datacenter in accordance with one embodiment of the present technology.

FIG. 9 is a diagram showing electric system operating data collection and sharing between different components of a datacenter in accordance with one embodiment of the present technology. The system 900 illustrated in FIG. 9 is one possible embodiment of the present technology and does not define the scope or set forth the bounds of the present technology.

The communicating circuit-breaker 104 is communicably connected to the networking device 102 and the PDU 110 via a datalink.

In this illustrative embodiment, the datalink is a power line communication (PLC) protocol over the power line 910. An AC source of electric power (not shown) provides electric power to the power distribution unit 110 via the power line 910, through the communicating circuit-breaker 104. The communicating circuit-breaker 104 is further configured to emits status signals to the networking device 102 over a datalink 902.

The PDU 110 distributes electric power to the power supply converter 210 connected to one of the electric power outlets of the PDU 110 via a power link 906. The power supply converter 210 provides the server 114 with adapted electric power via a power link 908. As described therebefore, the PDU 110 is configured to sense one or more power parameters relating to the electric power outlet connected to the power link 906. Electric system operating data relating to the power supply converter 210 and the server 114 generated therefrom are sent to the networking device 102 from the PDU 110 via the power line 910 upon receipt of a request from the networking device 102 via the power line 910.

In the same or another embodiment of the present technology, each request emitted by the networking device 102 is compliant with PCL G3 standard message length and header description and indicates the individual network address of a targeted PDU to be the receiver of the request.

In the same of another embodiment of the present technology, the electric system operating data is sent from the PDU 110 to the networking device 102 as electric system operating data frames, each electric system operating data frame comprising the electric system operating data relating to the one or more power parameters of each electric power outlet of the PDU 110 sampled during a certain period of time T2, the sampling rate equaling 1/T1.

Therefore, the networking device is configured to receive the status signal of the communicating circuit-breaker 104 via the datalink 902 and the electric system operating data from the PDU 110 over the power line 910. The status signal and the electric system operating data are further analysed and correlated to control and assess the correct functioning of the system. The networking device send a first command to a specific PDU when the electric system operating data received from the one PDU, in correlation with the signal status received from the communicating circuit-breaker connected to the one PDU, indicate an electric failure. Each PDU is further configured to disconnect one or more specific electric power outlets from the AC source of power of the PDU upon receipt of a command from the networking device.

Upon receipt of a second command from the networking device, each PDU is configured to connect one or more specific electric power outlets back to the AC source of power.

Although one server 114, one power supply converter 210, one power distribution unit 110 and one communicating circuit-breaker 104 are represented on FIG. 9, the system of the present disclosure may comprise a different number of servers, power supply converters, PDUs and communicating circuit-breakers. This is not a limitative aspect. The networking device 102 is usually connected to a plurality of communicating circuit-breakers, each communicating circuit-breaker being connected to a plurality of PDUs.

In the same or another embodiment of the present technology, the networking device 102 is further configured to send requests to the plurality of PDUs simultaneously.

In the same or another embodiment of the present technology, the networking device 102 is further configured to send requests to a group of PDUs each request being addressed to a distinct PDU.

In the same or another embodiment, a period of time T between a first sending of a first request by the networking device 102 to one or more PDUs and a second sending of a second request by the networking device 102 to the one or more PDU is adapted to the number of PDUs comprised in the system and the maximum data rate of the datalink, each PDU emitting one electric system operating data frame of a certain electric system operating data frame size in bits, according to the following equation:

$$\frac{N_1 * N_2 * S}{T} < D$$

where $N_1$ is the number of PDU in the system, $N_2$ is the number of electric power outlets of each PDU, S is the bit size of one electric system operating data frame, T is the period of time between two successive sendings of electric system operating data from the PDUs and D is the maximum data rate of the datalink which is a power line communication (PLC) protocol over the power line 910.

In this particular embodiment, the period of time T2 during which the one or more power parameters of the electric power outlets of each PDU are sampled before electric system operating data is generated is equal to T.

In one embodiment of the present technology and without being limitative, the system comprises one hundred and forty-four (144) PDUs, each PDU comprising eight (8) electric power outlets, the period of time between the sending of two successive requests from the networking device being five (5) seconds, and the data rate of the datalink operated over the power line 910 being 40 kb/s.

The system is further configured to allow the operator to adjust the period of time T2 and, consequently, the period of time T, according to the number of PDU, the number of electric power outlet of each PDU, the size of the electric system data frame emitted by each PDU and the maximum data rate D of the datalink.

Figure 10:
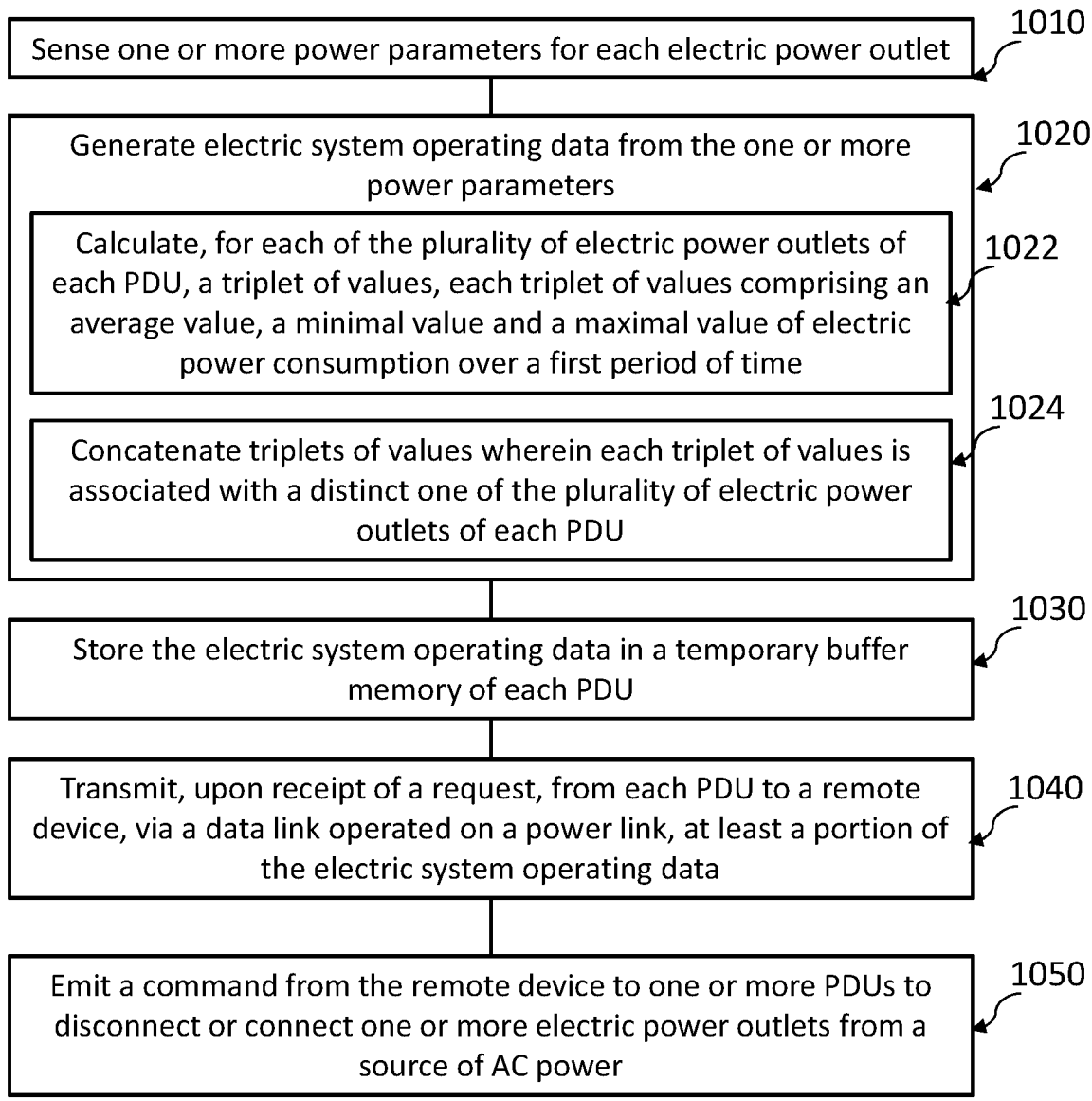
FIG. 10 is a sequence diagram showing operations of a method for monitoring electric systems of a datacenter in accordance with one embodiment of the present technology.

FIG. 10 is a sequence diagram showing operations of a method monitoring electric systems of a datacenter in accordance with one embodiment of the present technology. On FIG. 10, a sequence comprises a plurality of operations that may be executed in variable order, some of the operations possibly being executed concurrently, some of the operations being optional.

One or more power parameters of each electric power outlet of each PDU are sensed at operation 1010 at a first sampling rate, the one or more power parameters being a voltage, a current, an effective current, an instantaneous power level, an instantaneous active power, an instantaneous reactive power, a phase angle of the voltage relative to the current or a combination thereof. The processing unit of each PDU generates electric system operating data relating to each electric power outlet periodically at operation 1020 based on the one or more parameters sensed at operation 1010. In one embodiment of the present technology, the period of time T1 between two samplings of the one or more power parameters of each electric power outlet is lower than the period of time T2 between two generations of electric system operating data; the electric system operating data relating to one electric power outlet being based on the samplings of the one or more power parameters of said electric power outlet performed during a period of time equaling T2.

In one embodiment of the present technology, the generation of the electric system operating data relating to one of the electric power outlet of a PDU comprises calculation of a triplet of value relating to said electric power outlet at sub-operation 1022, comprising an average value of the electric power consumption over a period of time equaling T2, a minimal value of the electric power consumption over a period of time equaling T2 and a maximal value of the electric power consumption over a period of time equaling T2. The triplets of values relating to the same period of time may be concatenated at sub-operation 1024.

Upon generation of the electric system operating data, the processing unit of each PDU may transmit said electric system operating data to the temporary buffer memory of the PDU to be stored as electric system operating data frame at operation 1030, each electric system operating data frame relating to the one or more parameters of each electric power outlet of the PDU sampled during a period of time equaling T2 at a sampling rate equaling 1/T1. In the same or another embodiment, the electric system operating data frame comprises triplets of values, each triplet of values corresponding to one electric outlet of the PDU and the bit size of each electric system operating data frame is fixed and independent from the period of time T2.

Upon receipt of a request from the networking device, the communication module of each PDU sends at least one electric system operating data from the temporary buffer memory to the networking device via the datalink at operation 1040. In one embodiment, this data link is operated over the power line. In the same or another embodiment, the networking device is configured to emits request periodically, the relating period of time being equal to the period of time T2 between two generations of electric system operating data by each PDU.

The networking device may emit a command at operation 1050 to one or more specific PDU so that the processing unit of said PDUs emits a disabling or rearm signal, respectively leading to the disconnection or the connection of one or more electric power outlet of the PDU.

In the same or another embodiment, the networking device emits request to each PDU of the system simultaneously and periodically. The period of time T2 and the period of time between two successive emissions of request by the networking device are further adapted to the number of PDU in the system, the number of electric power outlet of each PDU and the maximum data rate of the datalink that may be operated of the power line, so that the reception of electric system operating data frames by the remote device relating to a first emission of requests is complete before a second emission of requests is performed, each electric system operating data frames having a fixed bit size independent from T2.

Figure 11:
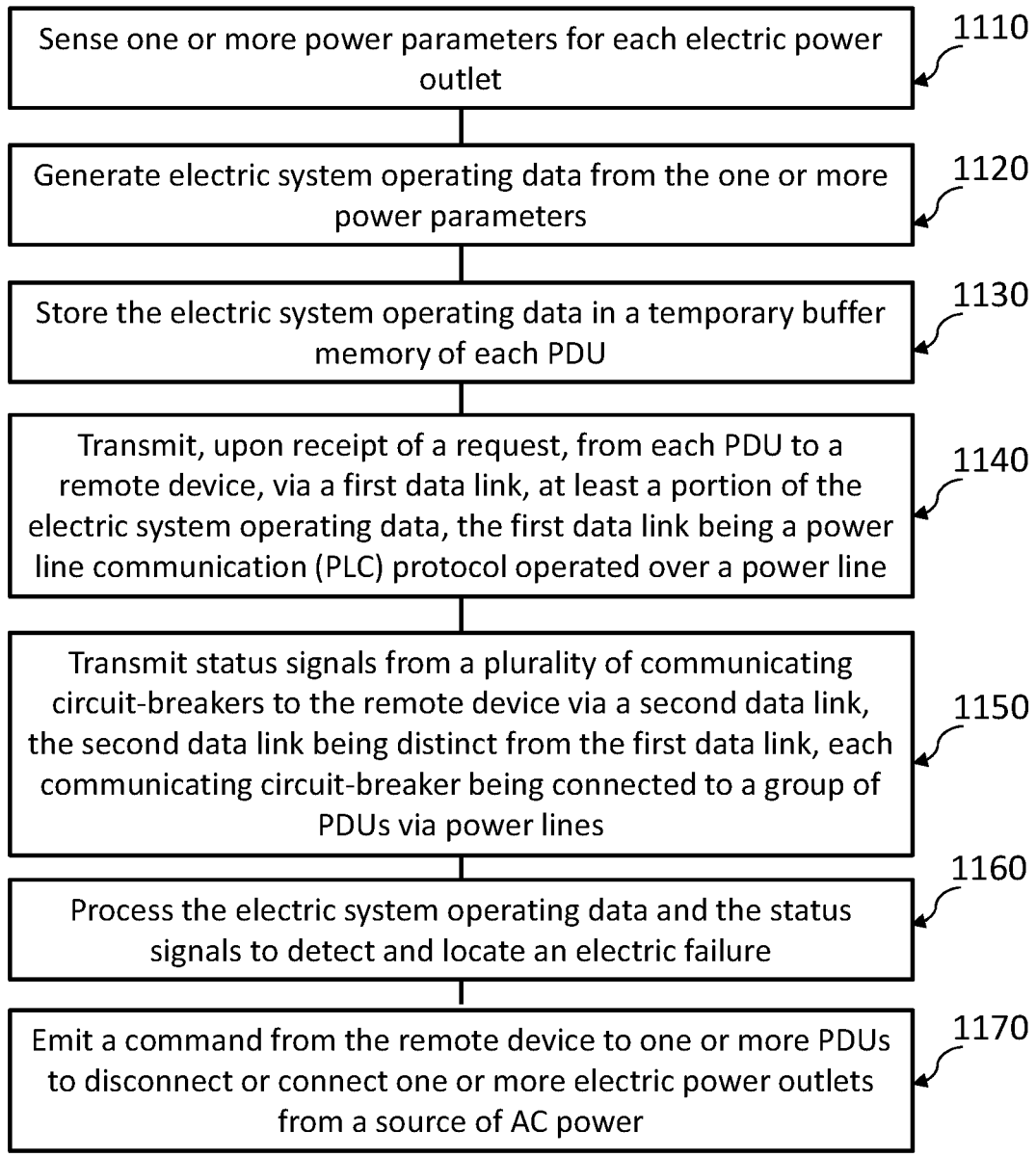
FIG. 11 is a sequence diagram showing operations of a method for locating an electric failure in a datacenter in accordance with one embodiment of the present technology.

FIG. 11 is a sequence diagram showing operations of a method for detecting an electric failure in a datacenter in accordance with one embodiment of the present technology. In one embodiment, a plurality of PDU are communicably connected to a remote device, that may be the networking device or the like, via a first network. The system comprises a plurality of communicating circuit breaker as described in FIG. 2, each communicating circuit breaker being connected to a plurality of PDUs via power lines and communicably connected to the remote device via a second network. On FIG. 11, a sequence comprises a plurality of operations that may be executed in variable order, some of the operations possibly being executed concurrently, some of the operations being optional.

The detection sub-circuit of each electric power outlet of each PDU is configured to sense one or more power parameters relating to its corresponding electric power outlet at operation 1110. The processing unit of each PDU, being communicably connected to the detection sub-circuit of each electric power outlet of said PDU and the temporary buffer memory of each PDU, generate electric system operating data relating to each electric power outlet at operation 1120. The temporary buffer memory is configured to receive and store the electric system operating data at operation 1130, the electric system operating data being associated with its relating electric power outlet and relating PDU.

In one embodiment, each PDU is associated with an individual network address. The electric system operating generated by the processing unit of a PDU contain the individual address of said PDU.

The communication module of each PDU sends, upon receipt of a request, the electric system operating data contained in the temporary buffer memory to the networking device at operation 1140. In one embodiment, the electric system operating data received from one PDU comprise an average value, a minimal value and a maximal value of the electric power consumption of each electric power outlet of the PDU over a certain period of time.

The communicating circuit-breakers send status signal to the remote device via the second network at sub operation 1150, each status signal being emitted by one communicating circuit-breaker and may be a real time communication regarding the state of the internal electric switch of said communicating circuit-breaker. Therefore, the status signal relating to one communicating circuit-breaker indicates if electric current is flowing through the PDUs connected to said communicating circuit-breaker.

The remote device receives the electric system operating data of the PDUs and the status signal from the communicating circuit-breaker, process said electric system operating data at operation 1160 to detect if an electric failure occurs within a PDU, an electric power outlet of a PDU, or a communicating circuit-breaker, which corresponds to a group of PDUs, the electric system operating data being associated with their corresponding PDU and corresponding electric power outlet, and the status signal being associated with their corresponding communicating circuit-breaker.

The remote device may emit one or more control commands at operation 1170 to one or more PDUs, each command being addressed to one PDU. Upon receipt of the control command, the PDU is configured to either disconnect or reconnect one or more electric power outlets, the identification of the one or more electric power outlets and the nature of the action of the PDU towards said electric power outlets being dependent of the control command.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each and every embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A system for electric system failure detection in a datacenter, the system comprising:
a plurality of power distribution units (PDUs), each of the plurality of PDUs comprising an electric power inlet, a plurality of electric power outlets and a memory, each of the plurality of PDU being configured to:
receive electric power from a power line connected to the electric power inlet;
distribute electric power to electric systems of the datacenter connected to the plurality of electric power outlets;
sense one or more power parameters relating to each of the electric power outlets;
generate electric system operating data from the one or more power parameters;
store the electric system operating data in the memory;
upon receipt of a request to transmit electric system operating data, transmit, via a first data link, at least a portion of the electric system operating data stored in the memory;
a plurality of communicating circuit-breakers connected to the plurality of PDUs by the power lines, each of the plurality of communicating circuit-breaker comprising an electric switch configured to emit a status signal;
a networking device communicably connected to the plurality of PDUs via the first data link and connected to the plurality of communicating circuit-breakers via a second data link, the second data link being distinct from the first data link, the networking device being configured to:
send requests to collect the electric system operating data;
receive the electric system operating data;
receive the status signal from the plurality of communicating circuit-breakers; and
detect an electric system failure based on the electric system operating data and the status signal.

2. The system of claim 1, wherein each of the plurality of PDUs comprises a processing unit communicably connected to the plurality of electric power outlets and configured to:
receive the one or more power parameters;
emits a disabling signal upon receipt of a command from the networking device or when the one or more power parameters exceeds a configurable power threshold;
emits a rearming signal upon receipt of a command from the networking device; each of the plurality of electric power outlets comprising:
a first relay selectively connecting the electric power outlet to a source of AC power, the first relay being responsive to the disabling signal to disconnect the electric power outlet from the source of AC power and, to the rearming signal, to connect the electric power outlet back to the source of AC power;
a first detector configured to:
receive the one or more power parameters, and
emits the disabling signal when the one or more power parameters exceeds a fixed power limit;
a combining logic configured to maintain the disabling signal once emitted until it receives a rearm signal.

3. The system of claim 1, wherein the electric system operating data generated by one of the plurality of PDUs and relating to the one or more power parameters of one of the plurality of electric power outlets of the one of the plurality of PDUs, is associated with the corresponding electric power outlet and the corresponding PDU.

4. The system of claim 1, wherein each of the plurality of PDUs and each of the plurality of communicating circuit-breakers is associated with an individual network address; the electric system operating data generated by one of the plurality of PDUs and relating to the one or more power parameters of one of the electric power outlets of the one of the plurality of PDUs, is associated with the corresponding electric power outlet and is associated with the individual network address of the corresponding PDU.

5. The system of claim 4, wherein the status signal emitted by each of the plurality of communicating circuit-breakers is associated with the individual network address of the corresponding communicating circuit-breaker.

6. The system of claim 4, wherein the networking device is further configured to:
- detect an electric failure based on the electric system operating data;
- determine a first individual network address associated with the occurrence of the electric failure; and
- send a command addressed to the first individual network address associated with the electric failure.

7. The system of claim 1, wherein the system comprises a plurality of power supply converters, each of the power supply converters receiving power from one of the plurality of PDUs and providing power to one of the electric systems of the datacenter.

8. The system of claim 1, wherein the system comprises a plurality of power supply converters, each of the power supply converters receiving power from one of the plurality of PDUs and providing power to a plurality of electric systems of the datacenter.

9. The system of claim 8, wherein the networking device is further configured to detect an electric failure of an electric system or a power supply converter relating to one of the plurality of PDUs based on the electric system operating data received from said PDU and relating to each electric power outlet of said PDU.

10. The system of claim 1, wherein the networking device sends the request to the plurality of PDUs simultaneously.

11. The system of claim 1, wherein the networking device sends the request to the plurality of PDUs sequentially, each request being addressed to a distinct PDU.

12. The system of claim 1, wherein the data link is a power line communication (PLC) protocol over the power lines.

13. The system of claim 1, wherein generating the electric system operating data from the one or more power parameters comprises calculating, for each of the plurality of electric power outlets of a given PDU, an average value of a first period of time, a minimal value over the first period of time and a maximal value over the first period of time.

14. A method for detecting an electric failure in a datacenter, the method comprising:
- sensing one or more power parameters relating to each of the electric power outlets of a power distribution unit (PDU);
- generating electric system operating data from the one or more power parameters relating to each electric power outlet, the electric system operating data being associated with its corresponding electric power outlet and corresponding PDU;
- storing the electric system operating data in a memory of the PDU;
- transmitting, upon receipt of a request, from the PDU to a remote device, via a first data link, at least a portion of the electric system operating data stored in the memory, the first data link being a power line communication (PLC) protocol operated over a power line, the power line providing electric power to the PDU;
- transmitting status signals from a communicating circuit-breaker to the remote device via a second data link, the second data link being distinct from the first data link, the communicating circuit-breaker being connected to the PDU via the power link; and
- processing the electric system operating data associated with its corresponding power outlet and the PDU and the status signals to detect and locate an electric failure, the location of the electric failure being associated with the PDU, one of the electric power outlet of the PDU, or the communicating circuit-breaker.

15. The method of claim 14, wherein, further to processing the electric system operating data and the status signals, the method further comprises:
- emitting a command from the networking device to the PDU;
- emitting a disabling or rearming signal by a processing unit of the PDU according to the command;
- disconnecting one or more of the plurality of outlets from a source of AC power upon emission of a disabling signal;
- connecting one or more of the plurality of outlets from the source of AC power upon emission of a rearming signal.

* * * * *

UNITED STATES PATENT AND TRADEMARK OFFICE
CERTIFICATE OF CORRECTION

PATENT NO. : 11,157,057 B1
APPLICATION NO. : 17/308820
DATED : October 26, 2021
INVENTOR(S) : Patrick-Gilles Maillot et al.

It is certified that error appears in the above-identified patent and that said Letters Patent is hereby corrected as shown below:

In the Claims

Column 20, Claim 2, Lines 35-50 should read --emit a disabling signal upon receipt of a command from the networking device or when the one or more power parameters exceeds a configurable power threshold;
emit a rearming signal upon receipt of a command from the networking device; each of the plurality of electric power outlets comprising:
a first relay selectively connecting the electric power outlet to a source of AC power, the first relay being responsive to the disabling signal to disconnect the electric power outlet from the source of AC power and, to the rearming signal, to connect the electric power outlet back to the source of AC power;
a first detector configured to:
receive the one or more power parameters, and
emit the disabling signal when the one or more power parameters exceeds a fixed power limit;--

Signed and Sealed this
Fourth Day of January, 2022

Drew Hirshfeld
*Performing the Functions and Duties of the*
*Under Secretary of Commerce for Intellectual Property and*
*Director of the United States Patent and Trademark Office*